United States Patent
Lee et al.

(10) Patent No.: US 9,859,191 B2
(45) Date of Patent: Jan. 2, 2018

(54) SEMICONDUCTOR DEVICE INCLUDING CONDUCTIVE VIA WITH BUFFER LAYER AT TAPERED PORTION OF CONDUCTIVE VIA

(71) Applicants: Ho-Jin Lee, Seoul (KR); Byung Lyul Park, Seoul (KR); Jin Ho An, Seoul (KR)

(72) Inventors: Ho-Jin Lee, Seoul (KR); Byung Lyul Park, Seoul (KR); Jin Ho An, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/065,903

(22) Filed: Mar. 10, 2016

(65) Prior Publication Data

US 2016/0268182 A1 Sep. 15, 2016

(30) Foreign Application Priority Data

Mar. 10, 2015 (KR) ........................ 10-2015-0033254

(51) Int. Cl.
*H01L 23/48* (2006.01)
*H01L 21/768* (2006.01)
(Continued)

(52) U.S. Cl.
CPC ...... *H01L 23/481* (2013.01); *H01L 21/76831* (2013.01); *H01L 21/76898* (2013.01); *H01L 23/5384* (2013.01); *H01L 23/5385* (2013.01); *H01L 23/3128* (2013.01); *H01L 23/53238* (2013.01); *H01L 2224/16145* (2013.01); *H01L 2224/16225* (2013.01); *H01L 2924/15311* (2013.01); *H01L 2924/181* (2013.01)

(58) Field of Classification Search
CPC ......... H01L 21/76831; H01L 21/76898; H01L 21/76804; H01L 23/481; H01L 23/5384; H01L 23/3128; H01L 2224/16145
See application file for complete search history.

(56) References Cited

U.S. PATENT DOCUMENTS 7,094,701 B2 8/2006 Umemoto et al.
7,416,963 B2 8/2008 Umemoto et al.
(Continued)

FOREIGN PATENT DOCUMENTS

JP 2006-012953 A 1/2006
JP 4265668 B2 2/2009
(Continued)

*Primary Examiner* — Mohsen Ahmadi
(74) *Attorney, Agent, or Firm* — Volentine & Whitt, PLLC

(57) ABSTRACT

A semiconductor device includes a semiconductor substrate, a circuit layer including an interlayer insulating layer on an upper surface of the substrate, and a conductive via penetrating through the interlayer insulating layer and the substrate, and electrically connected to the circuit layer. The device further includes an insulating layer surrounding the conductive via, and located between the conductive via and the substrate and between the conductive via and interlayer insulating layer, and a buffer layer located between the insulating layer and the conductive via, and overlapping at least a portion of the interlayer insulating layer in a depth direction of the conductive via.

11 Claims, 22 Drawing Sheets

(51) Int. Cl.
 *H01L 23/538* (2006.01)
 *H01L 23/31* (2006.01)
 *H01L 23/532* (2006.01)

(56) References Cited

U.S. PATENT DOCUMENTS

| | | | |
|---|---|---|---|
| 7,691,748 B2 | 4/2010 | Han | |
| 8,141,243 B2 | 3/2012 | Nakamura | |
| 8,492,902 B2 | 7/2013 | Lee et al. | |
| 2004/0061238 A1* | 4/2004 | Sekine | H01L 21/76898 257/774 |
| 2006/0148250 A1* | 7/2006 | Kirby | H01L 21/76898 438/667 |
| 2011/0193241 A1* | 8/2011 | Yen | H01L 21/76898 257/774 |
| 2013/0181330 A1* | 7/2013 | Ramachandran | H01L 21/76804 257/621 |
| 2013/0234341 A1 | 9/2013 | Onai | |
| 2013/0249045 A1* | 9/2013 | Kang | H01L 23/481 257/499 |
| 2014/0008816 A1* | 1/2014 | Yoda | H01L 23/481 257/774 |
| 2015/0137326 A1* | 5/2015 | Kang | H01L 23/481 257/621 |
| 2016/0155685 A1* | 6/2016 | Chen | H01L 23/481 257/762 |

FOREIGN PATENT DOCUMENTS

| | | |
|---|---|---|
| JP | 2014-143237 | 8/2014 |
| KR | 10-2008-0090826 A | 10/2008 |
| KR | 10-1430202 B1 | 8/2014 |

\* cited by examiner

SEMICONDUCTOR DEVICE INCLUDING CONDUCTIVE VIA WITH BUFFER LAYER AT TAPERED PORTION OF CONDUCTIVE VIA

CROSS-REFERENCE TO RELATED APPLICATIONS

A claim of priority under 35 U.S.C. §119 is made to Korean Patent Application No. 10-2015-0033254, filed Mar. 10, 2015, in the Korean Intellectual Property Office, the entire contents of which are hereby incorporated by reference.

BACKGROUND

Example embodiments of the inventive concept relate to semiconductor devices, and more particularly, to semiconductor devices including through electrodes and to methods of fabricating semiconductor devices including through electrodes.

A through electrode, such as a through-silicon-via (TSV), includes a conductive via that penetrates completely through a substrate (e.g., a silicon wafer or chip). Generally, a semiconductor chip including through electrodes may be electrically connected to another semiconductor chip or printed circuit board (PCB) at a surface of the chip. This facilitates stacking of multiple chips one on top of the other to form a three-dimensional (3D) device package, which in turn can increase data-transfer speeds and reduce the size of a package footprint.

SUMMARY

According to an aspect of the inventive concepts, a method of fabricating a semiconductor device includes electrically coupling a substrate to a conductive via embedded in a first surface of the substrate while plasma etching a layer located over the first surface for connection to the conductive via through the layer, and subsequently removing an opposite second surface of the substrate such that the conductive via penetrates through the substrate.

The substrate and conductive via may be electrically grounded during the plasma etching.

The substrate may be electrically coupled to the conductive via through a gap in an insulation layer interposed between the substrate and the conductive via, and the gap may be at a bottom of the conductive via facing the opposite second surface of the substrate.

The conductive via may be electrically isolated from the substrate by the insulating layer after the removing of the opposite second surface of the substrate.

The removing of the opposite second surface of the substrate may include at least one of back grinding, chemical etching and chemical-mechanical polishing (CMP) the opposite second surface of the substrate.

According to another aspect of the inventive concepts, a method of fabricating a semiconductor device includes forming an opening in a first surface of a substrate, forming a first insulating layer on inner walls of the opening, forming a gap in the first insulating layer to expose the substrate within the opening, filling the opening with a conductive via, the conductive via electrically connected to the substrate through the gap in the first insulating layer, forming a conductive layer on an upper surface of the conductive via exposed by the opening, forming a second insulating layer on the conductive layer, and plasma etching the second insulating layer to expose at least a portion of the conductive layer while the conductive via is electrically connected to the substrate through the gap in the first insulating layer.

The substrate and conductive via may be electrically grounded during the plasma etching.

A gap in the first insulating layer may be formed at a bottom of the opening.

The method may further include removing an opposite second surface of the substrate such that the conductive via penetrates through the substrate and is electrically isolated from the substrate by the first insulating layer.

The method may further include, before forming the conductive layer, determining whether a void exists in the conductive via by measuring an impedance across the conductive via and the substrate. The impedance ma be measured at a wafer level with respect to a plurality of conductive vias. The method may further include, before forming the opening, forming an interlayer insulating layer on the first surface of the substrate, where the opening may be formed through the interlayer insulating layer into the first surface of the substrate, the first insulating layer may be formed on inner walls of the opening in the substrate and the interlayer insulating layer, and the conductive via may fill the opening in the substrate and the interlayer insulating layer. The method may further include, before filling the opening with the conductive via, forming a buffer layer on the first insulating layer within the opening so as to overlap the interlayer insulating layer in a depth direction of the opening. Also, the buffer layer may be formed so to partially overlap the substrate in the depth direction of the opening.

According to yet another aspect of the inventive concepts, a method of fabricating a semiconductor device includes forming an interlayer insulating layer on a first surface of a substrate, forming an opening that extends through the interlayer insulating layer to a depth within the first surface of the semiconductor substrate, forming a first insulating layer covering an inner surface of the opening, forming a buffer layer on the insulating layer within the opening, the buffer layer overlapping the interlayer insulating layer in a depth direction of the opening, removing a portion of the first insulating layer to expose the substrate at the bottom of the opening, filling the opening with a conductive via, wherein the conductive via is electrically connected to the exposed substrate at the bottom of the opening, forming a conductive layer on an upper surface of the conductive via, forming a second insulating layer over the conductive layer, plasma etching the second insulating layer to expose the conductive layer, and removing an opposite second surface of the substrate such that the conductive via penetrates through the substrate and is electrically isolated from the substrate by the first insulating layer.

The method may further include electrically grounding the substrate and the conductive via during the plasma etching.

The buffer layer may serve as an etch mask during the removing of the portion of the first insulating layer.

The opening may be formed to taper inwardly through the interlayer insulating layer in a depth direction, and the buffer layer may be formed in the opening to overlap at least a portion of the interlayer insulating layer in the depth direction. Also, the buffer layer may be formed in the opening to partially overlap the substrate in the depth direction.

According to still another aspect of the inventive concepts, a semiconductor device includes a semiconductor substrate, a circuit layer including an interlayer insulating layer on an upper surface of the substrate, a conductive via penetrating through the interlayer insulating layer and the substrate, and electrically connected to the circuit layer, an insulating layer surrounding the conductive via, and located between the conductive via and the substrate and between the conductive via and interlayer insulating layer, and a buffer layer located between the insulating layer and the conductive via, and overlapping at least a portion of the interlayer insulating layer in a depth direction of the conductive via.

The buffer layer may overlap an entirety of the interlayer insulating layer in the depth direction of the conductive via. Also, the buffer layer may overlap a portion of the substrate in a depth direction of the conductive via, or the buffer layer may not overlap a portion of the semiconductor substrate in a depth direction of the through electrode.

A thickness of the buffer layer may decrease in a depth direction of the conductive via.

A lower surface of the substrate may be an inactive service.

According to according to another aspect of the inventive concepts, a semiconductor device includes a semiconductor substrate, a circuit layer including an interlayer insulating layer on an upper surface of the substrate, a through electrode penetrating through the interlayer insulating layer and the substrate, and electrically connected to the circuit layer, wherein the conductive via includes a tapered portion penetrating through the interlayer insulating layer that decreases in width in a depth direction of the conductive via, an insulating layer surrounding the conductive via, and located between the conductive via and the substrate and between the conductive via and interlayer insulating layer, and a buffer layer located between at least part of the tapered portion of the conductive via and the insulating layer.

The conductive via may further include a non-tapered portion penetrating through the substrate that is constant in width in the depth direction of the conductive via. The tapered portion of the conductive via may extend from an upper surface of the interlayer insulating layer to a lower surface of the interlayer insulating layer, and the non-tapered portion of the conductive via may extend from the upper surface of the substrate to a lower surface of the substrate.

The buffer layer may be further located between an upper part of the non-tapered portion of the conductive via and the insulating layer.

The buffer layer may be not located between an upper part of the non-tapered portion of the conductive via and the insulating layer.

A thickness of the buffer layer may decrease in a depth direction of the conductive via.

The buffer layer may completely surround the tapered portion of the conductive via.

A minimum inner diameter of the buffer layer may be less than a minimum inner diameter of the insulating layer.

The semiconductor device may further include a barrier layer interposed between the conductive via and the insulating layer, and between the conductive via and the buffer layer.

A thickness of the insulating layer may very in a depth direction of the conductive via.

A lower surface of the substrate may be inactive.

According to another aspect of the inventive concepts, a semiconductor device includes a substrate having an active surface and an inactive surface opposite the active surface, a circuit layer including an interlayer insulating layer on the active service of the substrate, a conductive via penetrating through the interlayer insulating layer and substrate, and electrically connected to the circuit layer, an insulating layer surrounding the conductive via, and located between the conductive via and the substrate and between the conductive via and interlayer insulating layer, and a buffer layer surrounding an upper portion of the conductive via opposite the inactive surface of the substrate, and located between the insulating layer and the upper portion of the conductive via.

A thickness of the buffer layer may decrease in a depth direction of the conductive via away from the active surface, and/or a width of the upper portion of the conductive via may decrease in the depth direction of the conductive via away from the active surface.

According to still another aspect of the inventive concepts, a chip package includes a package substrate including an upper surface, and at least one semiconductor chip embedded within an encapsulant and mounted on the upper surface of the package substrate. Each of the at least one semiconductor chips includes a semiconductor substrate, a circuit layer including an interlayer insulating layer on an upper surface of the substrate, a conductive via penetrating through the interlayer insulating layer and the substrate, and electrically connected to the circuit layer, an insulating layer surrounding the conductive via, and located between the conductive via and the substrate and between the conductive via and interlayer insulating layer, and a buffer layer located between the insulating layer and the conductive via, and overlapping at least a portion of the interlayer insulating layer in a depth direction of the conductive via.

The at least one semiconductor chip may be a stacked plurality of semiconductor chips embedded within the encapsulant.

BRIEF DESCRIPTION OF THE DRAWINGS

Example embodiments will become clearly understood from the detailed description that follows with reference to accompanying drawings. The accompanying drawings represent non-limiting, example embodiments as described herein.

Figure 1:
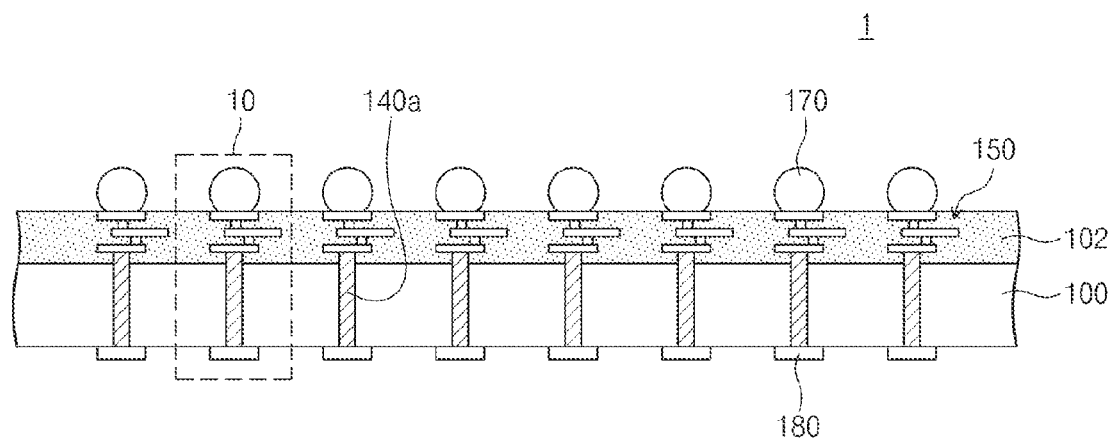
FIG. 1 is a sectional view illustrating a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a sectional view illustrating a semiconductor device according to example embodiments of the inventive concept.

Referring to FIG. 1, a semiconductor device 1 of this example includes a semiconductor substrate 100, a circuit layer 102 on a surface of the semiconductor substrate 100, and a plurality of electrical connection structures 10 that are electrically connected to the circuit layer 102. As examples, the semiconductor device 1 may be a memory chip, a logic chip, or a chip having a combination of memory and logic circuits. In addition, the semiconductor substrate 100 depicted in FIG. 1 may be a wafer-level or chip-level silicon substrate.

Still referring to FIG. 1, each electrical connection structure 10 may include a through electrode (or through-silicon-via (TSV)) 140a that penetrates the semiconductor substrate 100. In addition, each electrical connection structure 10 may include an upper terminal 170, one or more conductive lines (or traces) 150, and a lower terminal 180. Also, each conductive via 140a may extend so as to partially penetrate the circuit layer 102.

Figure 2A:
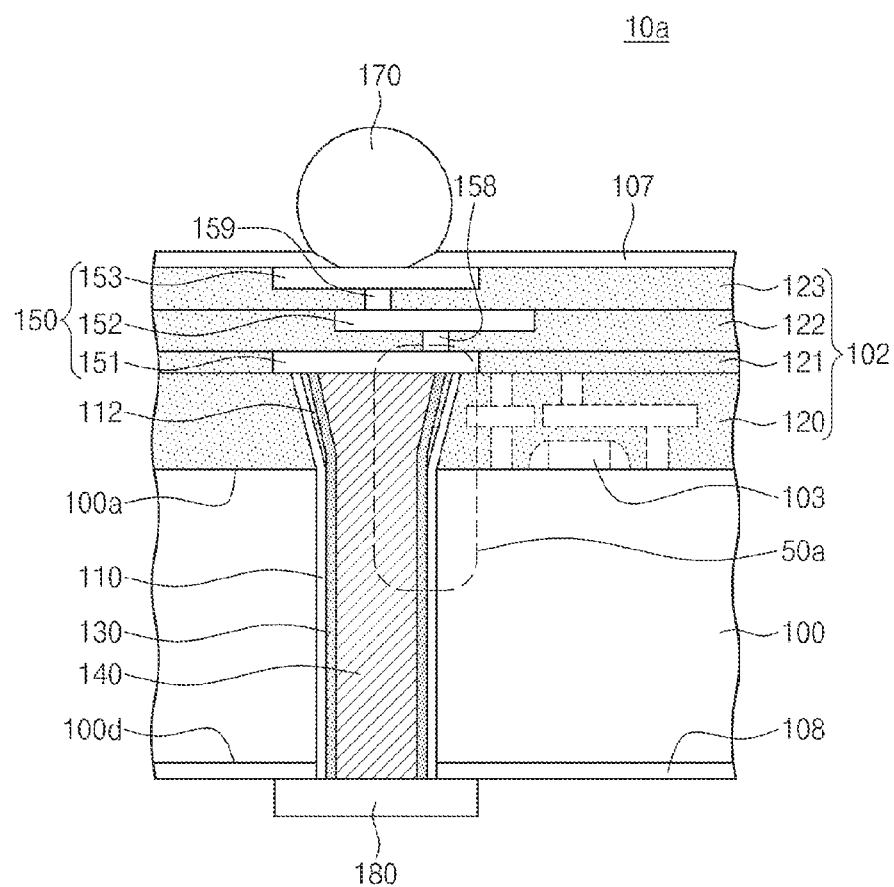
FIG. 2A is an enlarged sectional view illustrating a portion of FIG. 1 according to an example embodiment of the inventive concept.
Figure 2B:
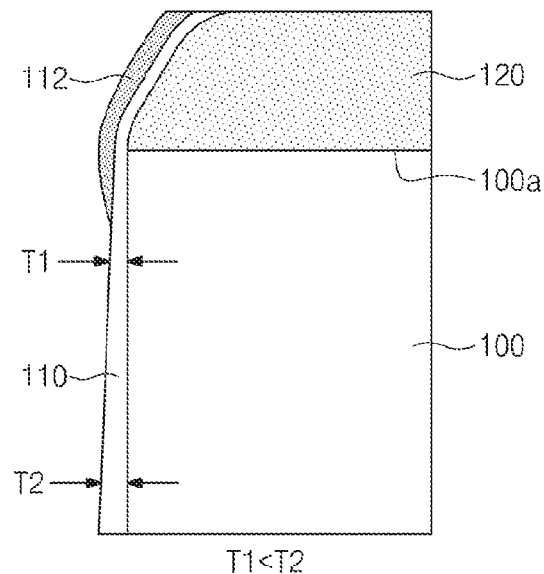
FIG. 2B is an enlarged sectional view illustrating a portion of FIG. 2A according to an example embodiment of the inventive concept.
Figure 2C:
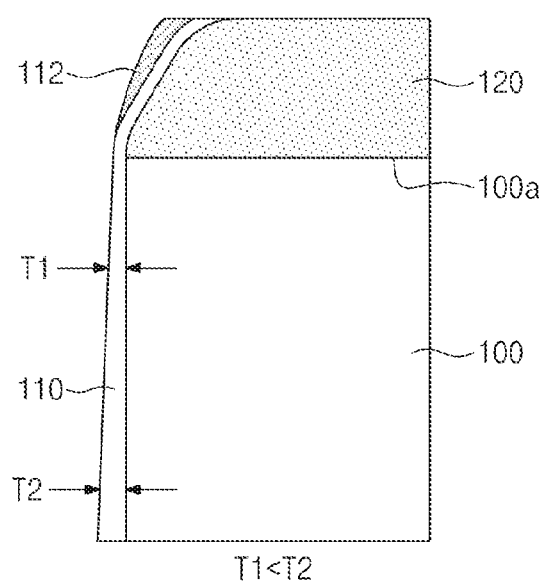
FIGS. 2C and 2D are sectional views illustrating respective modifications of the example embodiment of FIG. 2B.
Figure 2D:
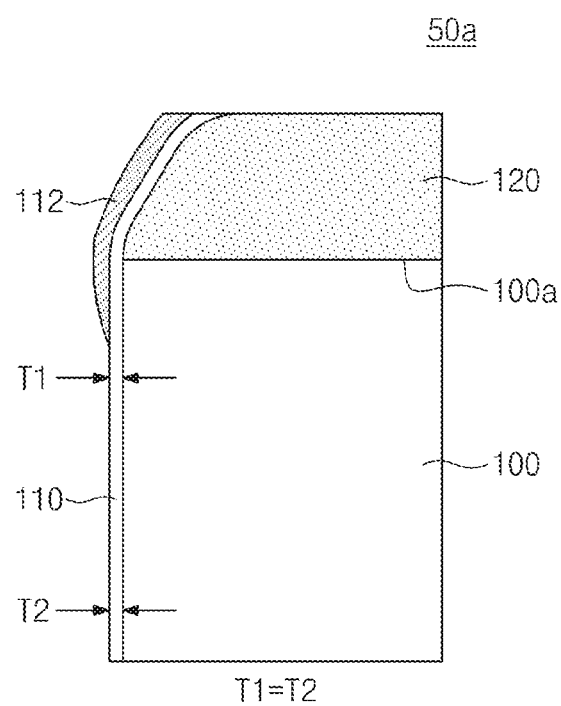

FIG. 2A is an enlarged sectional view illustrating a dashed-line enclosed portion of FIG. 1 according to an embodiment of the inventive concepts. FIG. 2B is an enlarged sectional view illustrating a dashed-line enclosed portion 50a of FIG. 2A according to an example embodiment of the inventive concept. FIGS. 2C and 2D are sectional views illustrating other example embodiments of the dashed-line enclosed portion 50a of FIG. 2A.

Referring to FIG. 2A, a vertical connecting portion 10a, which constitutes an example of the electrical connection structure 10 of FIG. 1, includes a semiconductor substrate 100 having an active surface 100a and an inactive surface 100d, a circuit layer 102 located on the active surface 100a and including a plurality of interlayer insulating layers 120, 121, 122 and 123, and a conductive via 140 vertically penetrating the semiconductor substrate 100 and the interlayer insulating layer 120 of the circuit layer. The conductive via 140 may be disposed near or in an integrated circuit 103 of the circuit layer 102.

In the example of this embodiment, an upper portion of the conductive via is tapered. Namely, a width of the upper portion of the conductive via 140 decreases in a direction towards the active surface 100a of the semiconductor substrate 100, i.e., from an upper surface of an interlayer insulating layer 120 to a lower surface of the interlayer insulating layer 120. More particularly, in the non-limiting example of this present embodiment, the conductive via 140 includes a tapered portion overlapping side surfaces of the interlayer insulating layer 120 (i.e., penetrating the interlayer insulating layer 120), and a non-tapered portion of constant width penetrating the semiconductor substrate 100. However, embodiments of the inventive concept are not limited in this fashion, and as another example, the outer surface of the conductive via 140 may define a cylinder of constant width throughout its vertical direction.

The vertical connecting portion 10a may further include an upper terminal 170 and/or a lower terminal 180 electrically connected to the conductive via 140. In the non-limiting example of this embodiment, the upper terminal 170 is a solder ball and the lower terminal 180 is a metal pad. In this case, the upper terminal 170 may be electrically connected to the conductive via 140 via metal lines 150 embedded in the circuit layer 102, while the lower terminal 180 may be directly or indirectly coupled to a bottom surface of the conductive via 140. In addition, a lower insulating layer 108 may be provided as a protection layer on the inactive surface 100d of the semiconductor substrate 100 to electrically separate the lower terminal 180 from the semiconductor substrate 100.

The conductive via 140 may be electrically isolated from the semiconductor substrate 100 by a via insulating layer 110 surrounding an outer surface of the conductive via 140. In addition, as shown in FIG. 2A, a barrier layer 130 may be interposed between the conductive via 140 and via insulating layer 110 to prevent constituents (e.g., copper) of the conductive via 140 from being diffused into the semiconductor substrate 100 and/or the circuit layer 102.

As is generally represented in FIG. 2A, the circuit layer 102 may include an integrated circuit 103 at the active surface 100a of the semiconductor substrate 100. The integrated circuit 103 may include components such as diffusion regions within the active surface 110a of the semiconductor substrate 100, and components such as gate electrodes embedded within one or more of the interlayer insulating layers 120, 121, 122 and 123. It will be well understood that the embodiments of the inventive concept are not limited by particularities of the integrated circuit 103, nor by the number and configuration of interlayer insulating layers 102. Likewise, any one or more of the interlayer insulating layers 120, 121, 122 and 123 shown in FIG. 2A may be comprised of more than one layer of insulating material and more than one type of insulating material.

For purposes of illustration, the metal lines 150 of FIG. 2A are depicted as including a first metal line 151 electrically connected to the conductive via 140, a third metal line 153 electrically connected to the upper terminal 170, a second metal line 152 interposed between the first metal line 151 to the third metal line 153, a first via 158 vertically connecting the first metal line 151 to the second metal line 152, and a second via 159 vertically connecting the second metal line 152 to the third metal line 153. Again, however, the embodiments of the inventive concept are not limited by the number and configuration of metal lines 150 and connecting vias 158/159.

Also for purposes of illustration, the example of FIG. 2A depicts the interlayer insulating layer 120 on the active surface 100a of the semiconductor substrate 100 and covering cover the integrated circuit 103, the interlayer insulating layer 121 encasing the first metal line 151 and covering the interlayer insulating layer 120, the second interlayer insulating layer 122 encasing the second metal line 152 and the first via 158 and covering the first interlayer insulating layer 121, and the third interlayer insulating layer 123 encasing the third metal line 153 and the second via 159 and covering the second interlayer insulating layer 122. In addition, an upper insulating layer 107 may be provided as a protection layer on the third interlayer insulating layer 123.

As also shown in FIG. 2A, in some example embodiments of the inventive concept, a buffer layer 112 is interposed between the conductive via 140 and via insulating layer 110. For example, the buffer layer 112 may be located so as to surround an upper region of the conductive via 140. Herein, for purposes of description only, the terms "upper" and "lower" respectively refer to up and down directions in the arbitrary orientation of the device as illustrated in FIG. 2A.

Additionally, in case where the barrier layer 130 is provided, the buffer layer 112 may be interposed between the barrier layer 130 and via insulating layer 110.

As one example, the buffer layer 112 overlaps a portion of the interlayer insulating layer 120 in a downward direction (i.e., a direction towards the inactive surface 110d) of the conductive via 140. In another example, the buffer layer 112 overlaps an entirety of the interlayer insulating layer 120 in a downward direction of the conductive via 140. In yet another example, the buffer layer 112 extends below the active surface 100a of the semiconductor substrate 100 so to overlap a portion of the substrate 100 in the downward direction of the conductive via 140. In this another example, the buffer layer 112 does not extend below the active surface 100a of the semiconductor substrate 100.

The via insulating layer 110 may have a uniform or non-uniform thickness in a direction parallel to the surfaces 100a and 100d of the substrate 100. In the example of FIG. 2B, a thickness of the via insulating layer 110 increases in a depth direction, i.e., in a direction towards the lower surface of the substrate 100. In the figure, the thickness T1 is less than the thickness T2. Also in the example of FIG. 2B, the buffer layer 112 on the side surface of the via insulating layer 110 overlaps an entirety of the interlayer insulating layer 12 (and the tapered portion of the conductive via 140 of FIG. 2A), and extends downward to partially overlap an inner surface of the semiconductor substrate 100 (and a part of the non-tapered portion of the conductive via 140 of FIG. 2A).

FIG. 2C illustrates another example in which the thickness of the via insulating layer 110 increases in a depth direction, i.e., in a direction towards the inactive surface 100d of the substrate 100. However, the example here differs from that of FIG. 2B in that the buffer layer 112 on the side surface of the via insulating layer 110 extend downward to partially overlap an inner surface of the semiconductor substrate 100.

FIG. 2D illustrate another example in which the via insulating layer 110 has a uniform thickness in a depth direction, i.e., in a direction towards the inactive surface 100d of the substrate 100. In the figure, the thickness T1 is equal to the thickness T2. Also in the example of FIG. 2D, the buffer layer 112 on the side surface of the via insulating layer 110 overlaps an entirety of the interlayer insulating layer 12, and extends downward to partially overlap an inner surface of the semiconductor substrate 100.

Figure 3A:
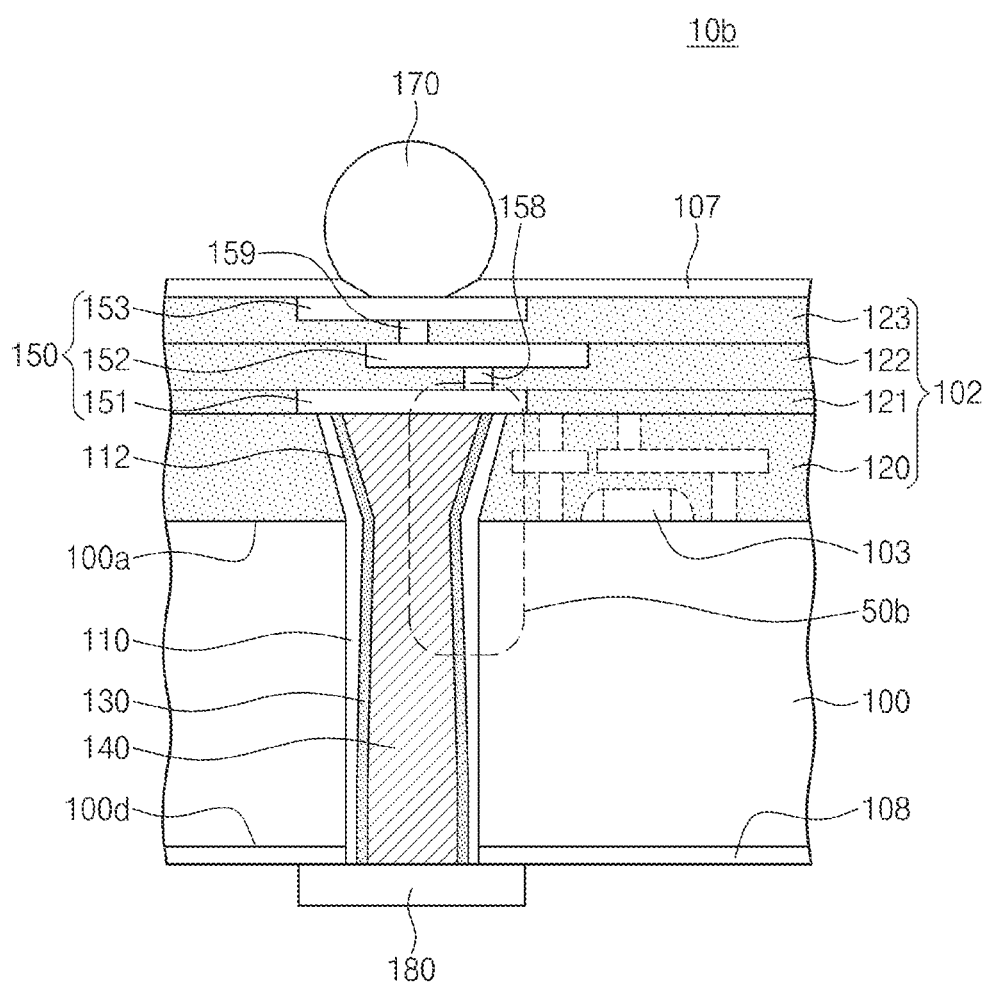
FIG. 3A is an enlarged sectional view illustrating a portion of FIG. 1 according to another example embodiment of the inventive concept.
Figure 3B:
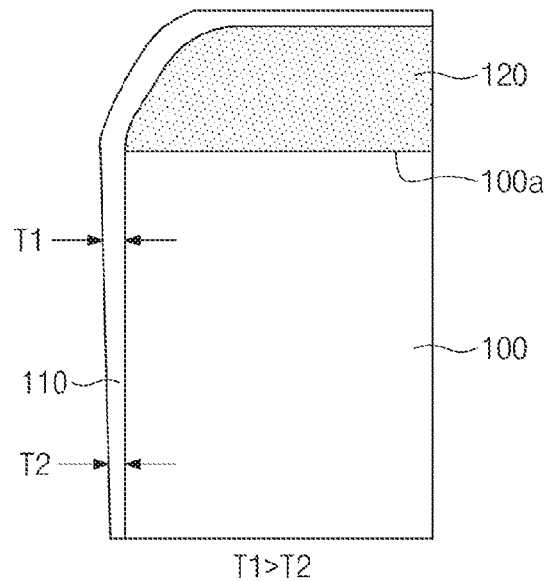
FIG. 3B is an enlarged sectional view illustrating a portion of FIG. 3A according to an example embodiment of the inventive concept.
Figure 3C:
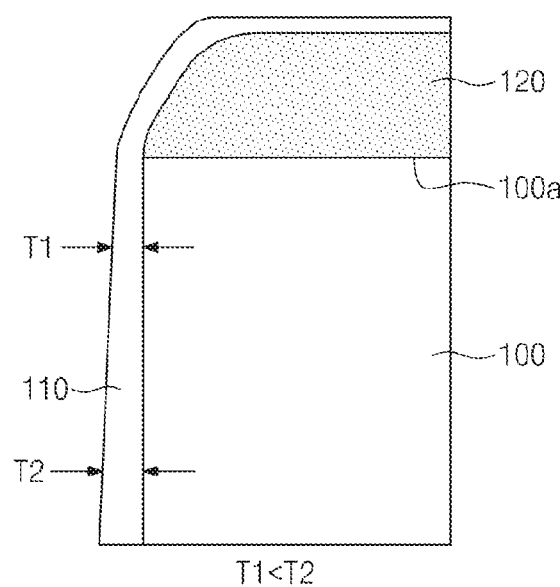
FIGS. 3C and 3D are sectional views illustrating respective modifications of the example embodiment of FIG. 3B.
Figure 3D:
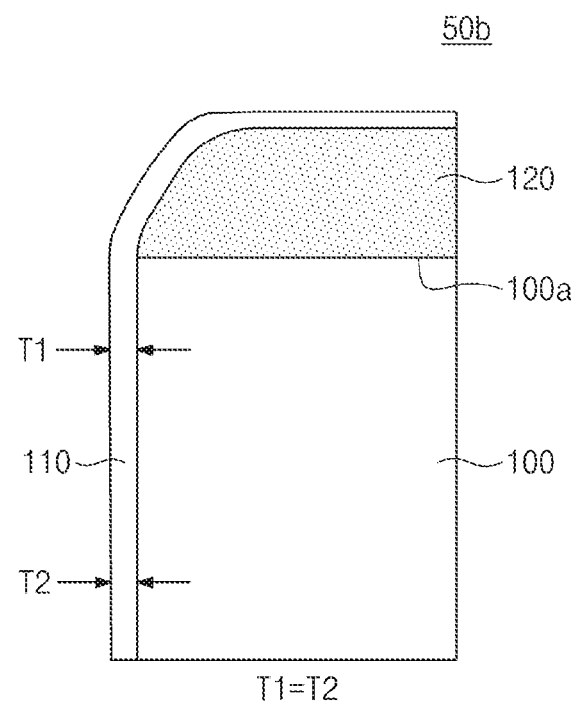

FIG. 3A is an enlarged sectional view illustrating another embodiment of a vertical connecting portion 10b as the electrical connection structure 10 of FIG. 1. FIG. 3B is an enlarged sectional view illustrating a portion 50b of FIG. 3A. FIGS. 3C and 3D are sectional views illustrating other embodiments of the portion 50b of FIG. 3A.

The embodiment of FIG. 3A differs from that of FIG. 2A in that the buffer layer 112 of FIG. 2A is omitted in the embodiment of FIG. 3A. Otherwise, the embodiment of FIG. 3A is that same as that of FIG. 2A, and like reference numbers are used to denote like elements in both figures. Thus, a detailed description of FIG. 3A is omitted here to avoid redundancy.

As shown by the examples of FIGS. 3B, 3C and 3D, the via insulating layer 110 of the embodiment of FIG. 3 can have a variety of different configuration. That is, in the example of FIG. 3B, the via insulating layer 110 has a thickness that increases in a depth direction, i.e., in a direction towards the inactive surface 110d of the substrate 100. That is, in FIG. 3B, the thickness T1 is greater than the thickness T2.

FIG. 3C illustrates another example in which via insulating layer 110 has a thickness that decrease in a depth direction, i.e., in a direction towards the inactive surface 110d of the substrate 100. That is, in FIG. 3C, the thickness T1 is less than the thickness T2.

FIG. 3D illustrates yet another example in which via insulating layer 110 has a constant thickness in a depth direction, i.e., in a direction towards the inactive surface 110d of the substrate 100. That is, in FIG. 3C, the thickness T1 is the same as the thickness T2.

A method of fabricating a semiconductor device will now be described with reference to the sectional views of FIGS. 4A through 4K and FIGS. 5A through 5C.

Figure 4A:
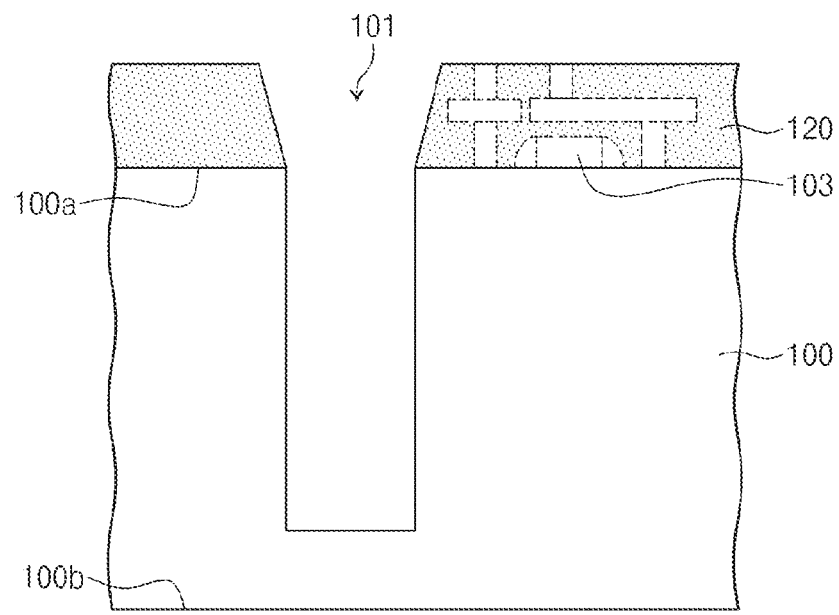
FIGS. 4A through 4K are sectional views for reference in describing a method of fabricating a semiconductor device according to example embodiments of the inventive concept.

Referring to FIG. 4A, a vertical hole (or opening) 101 may be formed in the semiconductor substrate 100. The semiconductor substrate 100 may have a top surface 100a provided with the integrated circuit 103 and a first bottom surface 100b opposite thereto. The semiconductor substrate 100 may be a wafer-level or chip-level silicon substrate. The top surface 100a may be an active surface, and the bottom surface 100b may be an inactive surface.

The interlayer insulating layer 120 may be formed on the top surface 100a of the semiconductor substrate 100 to cover the integrated circuit 103. The integrated circuit 103 may be a memory circuit, a logic circuit, or any combination thereof. The interlayer insulating layer 120 may, for example, be formed by depositing one or more silicon oxide layers and/or one or more silicon nitride layers.

The vertical hole 101 may be formed to extend in a depth direction from the top surface 100a of the semiconductor substrate 100 toward, but not reaching, the first bottom surface 100b. The vertical hole 101 may be formed to have a substantially vertical profile or a downward tapered profile, in the range from the top surface 100a to the first bottom surface 100b. The vertical hole 101 may be formed by etching the interlayer insulating layer 120 and the semiconductor substrate 100 near the integrated circuit 103 (for example, at or near a scribe lane, its neighboring region, or a region with the integrated circuit 103) using a dry etching process.

In the example of the present embodiment, the vertical hole 101 tapers inwardly (i.e., gradually decreases in width) in the depth direction through the interlayer insulating layer 120, and has a constant width in the depth direction through the semiconductor substrate 100. However, the inventive concepts are not limited in this matter. As one example of a variation, the vertical hole 101 has a constant width in the depth direction through at least part of the interlayer insulating layer 120, and as another example of a variation, the vertical hole 101 tapers inwardly in the depth direction through at least part of the semiconductor substrate 100.

Figure 4B:
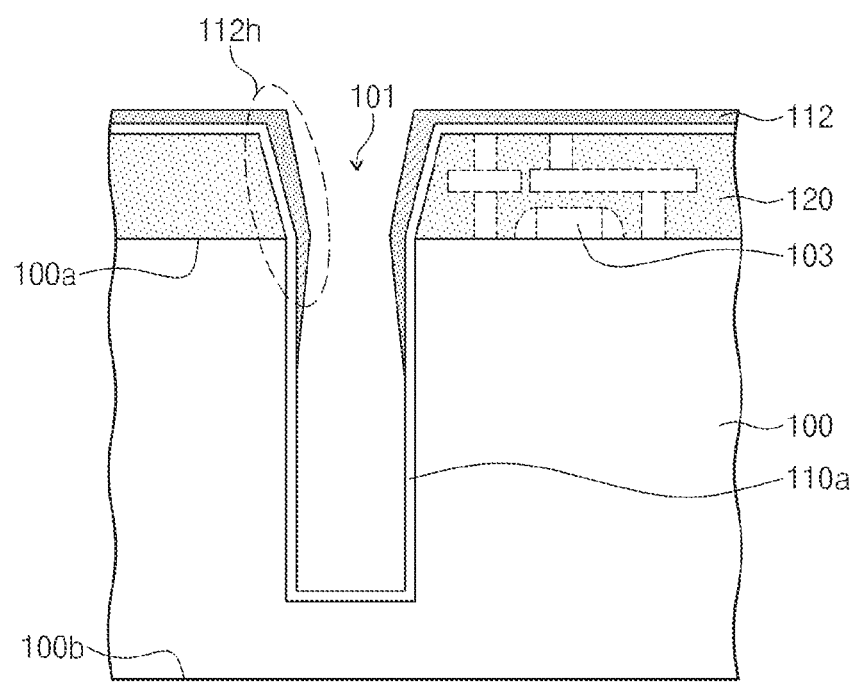

Referring to FIG. 4B, an insulating layer 110a may be formed in the vertical hole 101 to cover an inner surface of the vertical hole 101. The buffer layer 112 may be deposited on the insulating layer 110a to locally cover the insulating layer 110a at a top entrance portion of the vertical hole 101. In the example of FIG. 4B, the buffer layer 112 is formed in such a way that it extends below a plane of the active surface 100a. However, the inventive concepts are not limited in this manner. For example, the buffer layer 112 may instead be formed in such a way that it does not extend below a plane of the active surface 100a, thereby locally covering only an upper portion of the insulating layer 110a which overlaps the interlayer insulating layer 120.

The insulating layer 110a may be formed by deposition of, for example, a silicon oxide layer and/or a silicon nitride layer. In the meantime, the buffer layer 112 may be formed by deposition of an insulating material having less favorable step coverage properties than a material of the insulating layer 110a. For example, the buffer layer 112 may be formed by a plasma deposition process using silane gas. The less favorable step coverage properties of the material of the buffer layer 112 may result in the formation of overhang portion 112h on the top entrance of the vertical hole 101. This overhang portion 112h, which is effective to narrow the opening in the vertical hole 101, may be useful in carrying out a dry etching process described next.

Figure 4C:
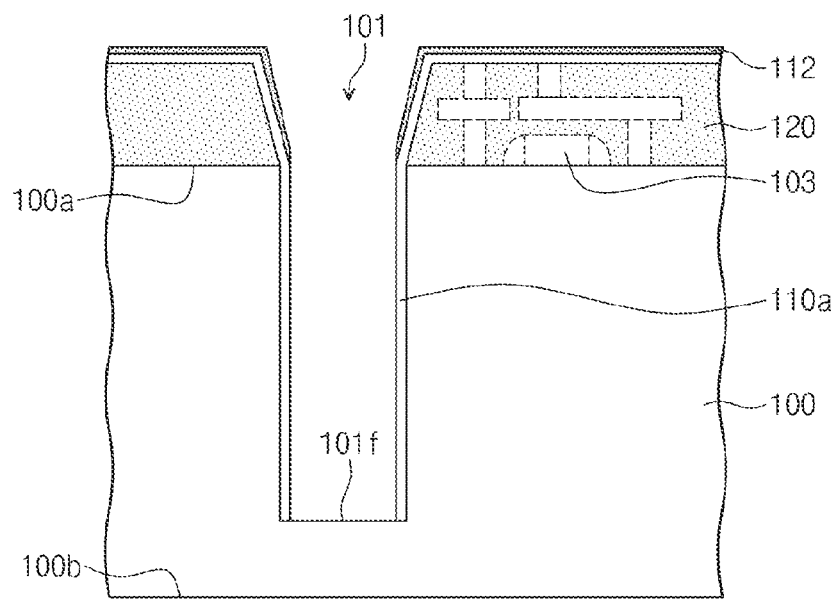

Referring to FIG. 4C, a dry etching process using the buffer layer 112 as an etch mask may be performed to remove a portion of the insulating layer 110a so as to expose the semiconductor substrate 100. As an example, the dry etching process may be performed to remove a portion of the insulating layer 110a located on a bottom surface 101f of the vertical hole 101, and thus, the semiconductor substrate 100 located at the bottom surface 101f of the vertical hole 101 may be exposed.

The buffer layer 112 may be partially removed during the dry etching process. Accordingly, as is schematically shown in FIG. 4C as compared to FIG. 4B, the buffer layer 112 may have a reduced thickness compared to its initial thickness after deposition. However, the inventive concepts are not limited in this matter. For example, the dry etching process may result in removal of the entirety of the buffer layer 112 from the top surface of the semiconductor substrate 100 and/or from the side surfaces within the vertical hole 101.

Figure 5A:
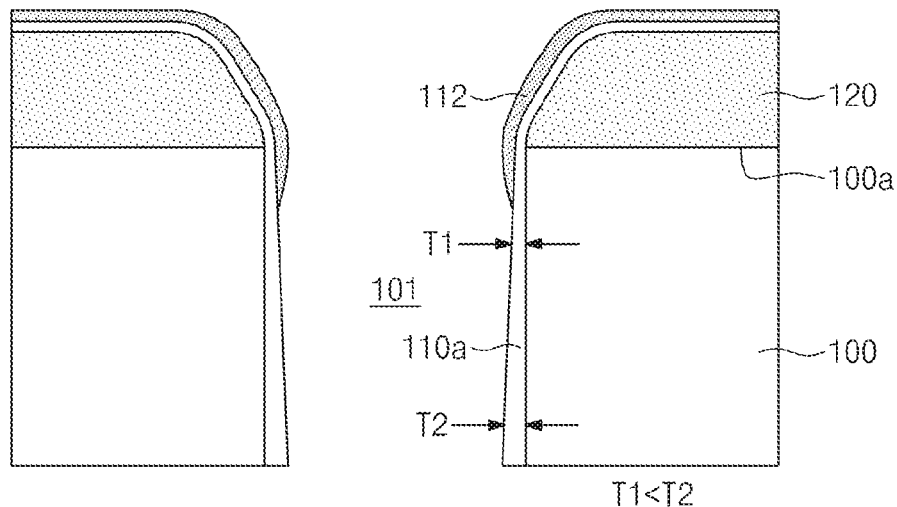
FIG. 5A is an enlarged sectional view illustrating a portion of FIG. 4C according to an example embodiment of the inventive concept.
Figure 5B:
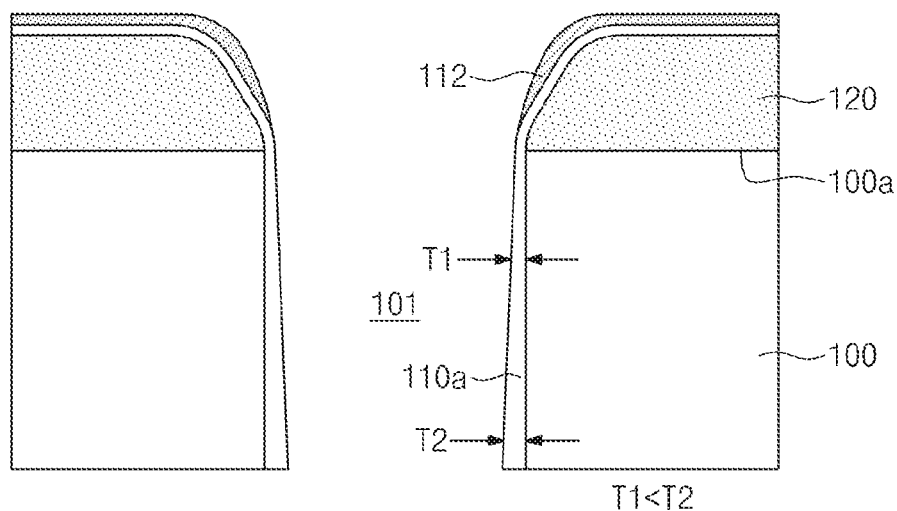
FIGS. 5B and 5C are sectional views illustrating respective modifications of the example embodiment of FIG. 5A.
Figure 5C:
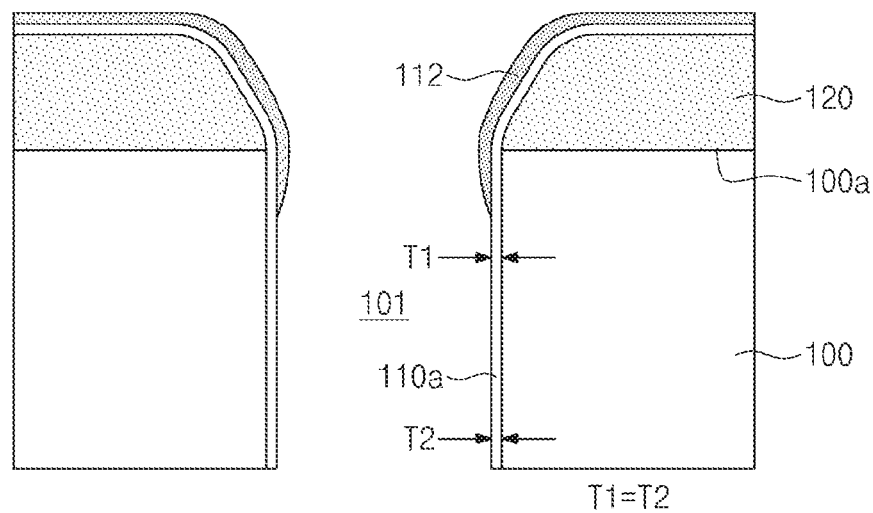

FIGS. 5A through 5C are presented to illustrate a few non-limiting examples of configurations of the buffer layer 112 and the insulating layer 110a after dry etching.

In particular, FIGS. 5A and 5B illustrate examples in which a thickness of the insulating layer 110a increases in a depth direction of the vertical hole 101. That is, in these figures, the thickness T1 is less than the thickness T2. This variation in thickness may result from a removal rate of the insulating layer 110a closer to the top of the vertical hole 101 being greater than a removal rate of the insulating layer 110a closer to the bottom of the vertical hole 101. On the other hand, the example of FIG. 5A differs from that of FIG. 5B in that FIG. 5B show greater removal of the buffer layer 112 during the dry etching process. Indeed, as described previously, the buffer layer 112 may be removed altogether.

The example of FIG. 5C differs from that of FIG. 5A in that the insulating layer 110a has a constant thickness in the depth direction of the vertical hole 101. In FIG. 5C, the thickness T1 is the same as the thickness T2.

Figure 4D:
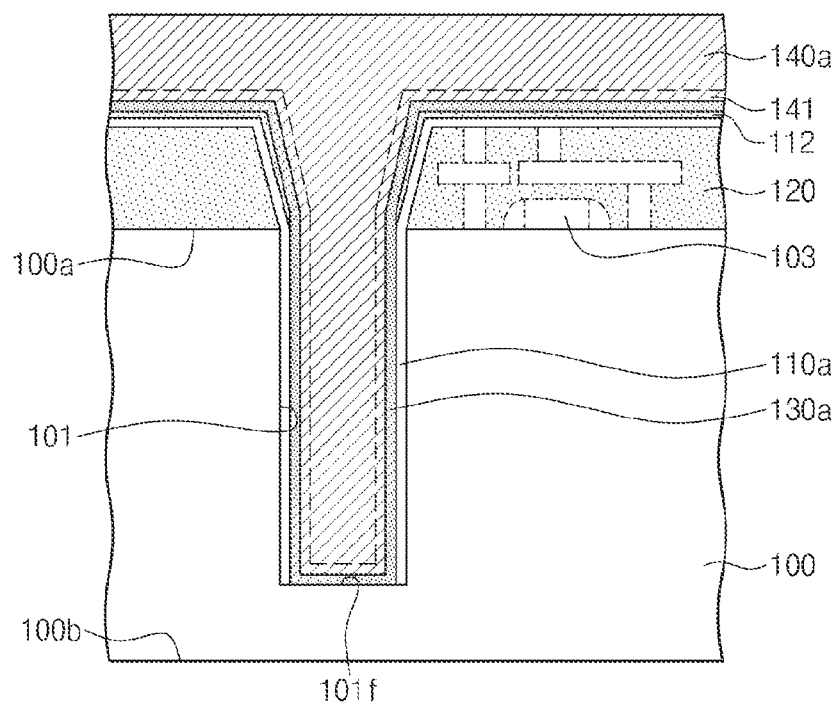

Referring now to FIG. 4D, a conductive layer 140a may be formed on the semiconductor substrate 100 to form a conductive via within the vertical hole 101. The conductive layer 140a may be formed by depositing or plating one or more conductive materials. A few examples of conductive materials include polysilicon, copper, tungsten, and aluminum.

The example of FIG. 4D also shows a metal layer 130a that functions as a diffusion barrier layer and that is deposited on the surfaces of the vertical hole 101 before formation of the conductive layer 140a. The metal layer 130a may be used depending on the conductive material of the conductive layer 140a. For example, in the case where the conductive layer 140a is formed of copper or a copper-containing conductive material, it may be necessary or advisable to first form the metal layer 130a to act as a barrier against copper otherwise diffusing into the semiconductor substrate 100 and/or integrated circuit 103. Examples of a material of the metal layer 130a include titanium (Ti), titanium nitride (TiN), chromium (Cr), tantalum (Ta), tantalum nitride (TaN), nickel (Ni), tungsten (W), tungsten nitride (WN), and combinations of any two or more thereof.

The example of FIG. 4D also illustrates a seed layer 141 which may be a metal layer deposited in the case where the conductive layer 140a is formed by electroplating, e.g., by a copper electroplating process. The seed layer 141 may be formed on the insulating layer 110a or the metal layer 130a, and then, an electroplating process using the seed layer 141 may be performed to form the conductive layer 140a.

As described previously with reference to FIG. 4C, the insulating layer 110a is partially removed in an etching process to expose, for example, the bottom surface 101f of the vertical hole 101. In the case where the metal layer 130a is omitted (not formed), the conductive layer 140a may be in direct contact with the semiconductor substrate 100. In the case where the metal layer 130a is formed (as shown in FIG. 4D), the metal layer 130a may be in direct contact with the semiconductor substrate 100. In either case, the semiconductor substrate 100 is in electrical contact with the conductive layer 140a.

Figure 4E:
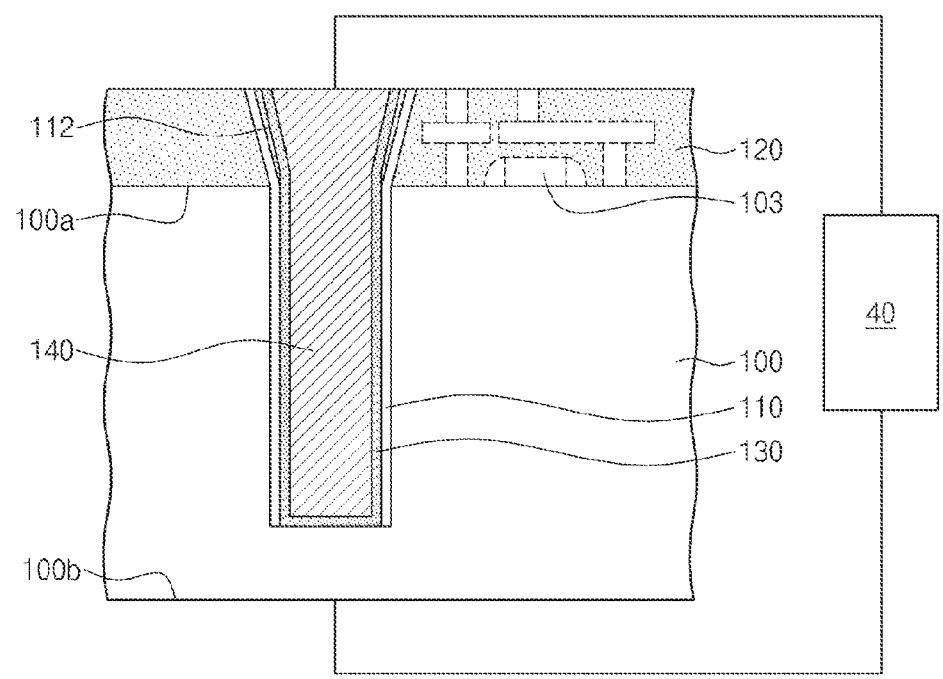

Referring now to FIG. 4E, a planarization process may be performed to expose the interlayer insulating layer 120. The planarization process may, for example, be performed using an etch-back or chemical-mechanical polishing process. The portion of the conductive layer 140a that remains after planarization is a conductive via 140 having the shape of a pillar vertically penetrating the semiconductor substrate 100 and the interlayer insulating layer 120. Also, the portion of the insulating layer 110a remaining after planarization is a via insulating layer 110 that electrically isolates side surfaces of the conductive via 140 from the semiconductor substrate 100. On the other hand, the bottom surface of the conductive via 140 is electrically connected to the semiconductor substrate 100 through the opening in the via insulating layer 110.

The portion of the metal layer 130a (if formed) remaining after planarization is a barrier layer 130. As discussed previously, the barrier layer 130 may prevent constituents (e.g., Cu) of the conductive via 140 from being diffused into the semiconductor substrate 100 and/or the integrated circuit 103.

After planarization, a portion of the buffer layer 112 (if present) may remain on an upper side surface of the conductive via 140 overlapping the interlayer insulating layer 120. In the example of FIG. 4E, the buffer layer 112 is sandwiched between the via insulating layer 110 and the barrier layer 130 at a top portion of the conductive via 140.

Reference number 40 of FIG. 4E denotes an electronic device (e.g., an impedance measuring device) that may be used to measure an impedance of the conductive via 140. That is, as described previously, the conductive via 140 and the semiconductor substrate 100 are electrically coupled to each other. Accordingly, by electrically connecting an electronic device 40 across the conductive via 140 and the semiconductor substrate 100, it is possible to determine whether an electric resistance or impedance of the conductive via 140 is within acceptable parameters. For example, an electric resistance or impedance in excess of acceptable parameters may evidence the presences of a void or other defect in the conductive via 140.

Figure 4F:
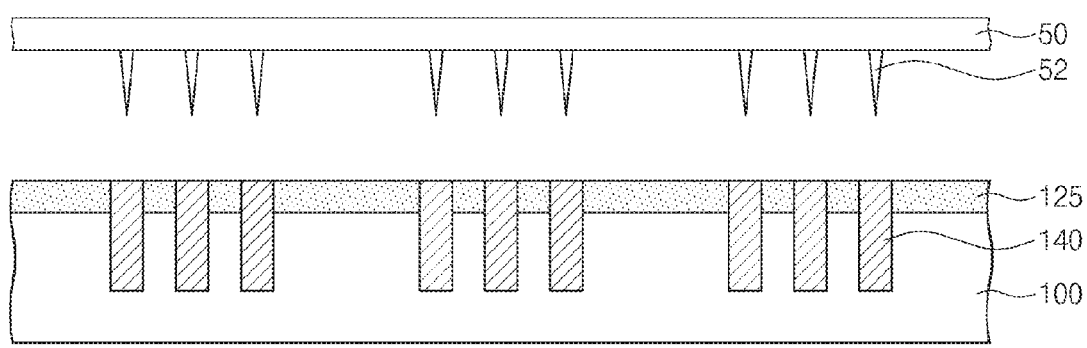

An electrical testing may be individually performed on each of the conductive vias 140. Alternatively, as represented in FIG. 4F, a probe card 50 having probes 52 may be used to simultaneously or in parallel conduct electrical testing of plural conductive vias 140. This may be carried out at either a chip level or a wafer level. In addition, the electrical testing on the conductive vias 140 may be performed in an electrical die sorting (EDS) process. In this case, it is possible to sort out a failed chip having a defective the conductive via 140.

The electrical testing on the conductive via 140 described above may be performed upon completion of the planarization process described above. However, the inventive concepts are not limited in this manner.

Figure 4G:
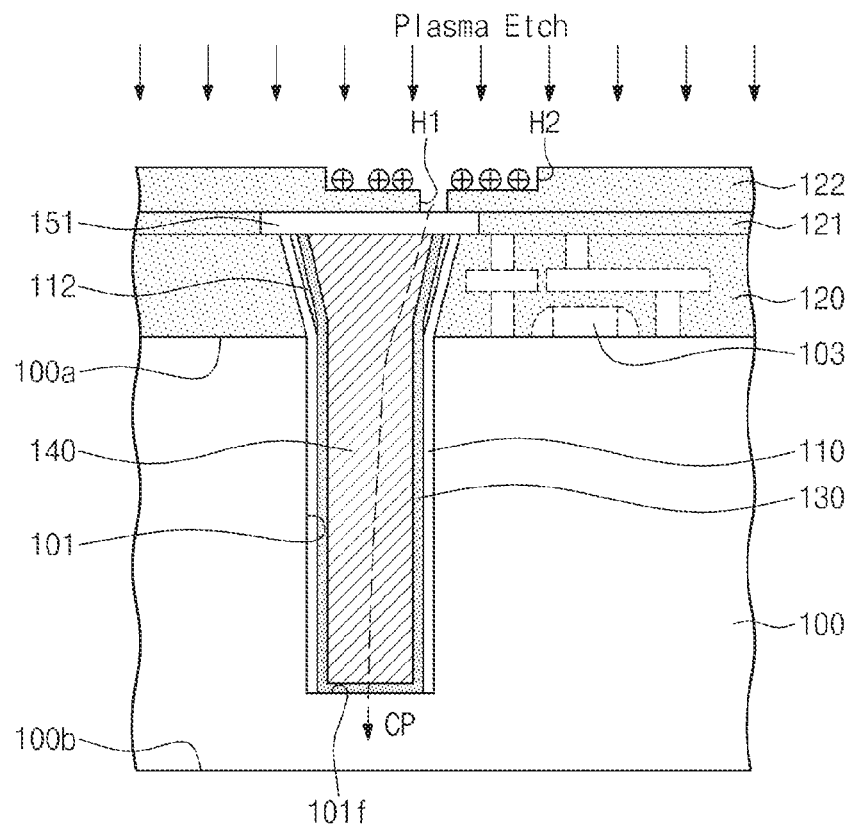

Referring now to FIG. 4G, a first metal line 151 may be formed on the interlayer insulating layer 120 to be electrically connected to the conductive via 140. As an example, an insulating layer (e.g., a silicon oxide layer, a silicon nitride layer, or a silicon oxynitride layer) may be formed on the interlayer insulating layer 120 to form a first interlayer insulating layer 121, and then, the first metal line 151 made of a metallic material (e.g., copper or aluminum) may be formed using, for example, a damascene process. The first metal line 151 may be formed in a gap of the first insulating layer 121 so as to be coupled to the conductive via 140. As another example, a conductive layer may be deposited and patterned to form the first metal line 151 on the interlayer insulating layer 120, and then, an insulating layer may be deposited to form the first interlayer insulating layer 121.

Still referring to FIG. 4G, a via hole H1 and a trench H2 may be formed. For example, the formation of the via hole H1 and the trench H2 may include forming the second interlayer insulating layer 122 on the first interlayer insulating layer 121 and performing a plasma etching process on the second interlayer insulating layer 122. As an example, a portion of the second interlayer insulating layer 122 may be etched by a plasma etching process to form the trench H2, and then, a portion of the second interlayer insulating layer 122 may be etched by a plasma etching process to form the via hole H1 below the trench H2. The second interlayer insulating layer 122 may be formed using a deposition process in which an insulating layer of a material that is the same as or similar to that of the first interlayer insulating layer 121 is deposited.

The via hole H1 may be formed to overlap at least a portion of the first metal line 151, when viewed in a plan view. The trench H2 may be formed to overlap at least a portion of the via hole H1. As a result of such overlapping, the via hole H1 may expose the first metal line 151 and the trench H2 may be spatially connected to the via hole H1.

During the plasma etching process for forming the trench H2, plasma charges may be accumulated in the trench H2. When the via hole H1 is formed, the plasma charges accumulated in the trench H2 may pass through the via hole H1 to migrate into the conductive via 140 via the first metal line 151. Since the conductive via 140 is electrically connected to the semiconductor substrate 100, the plasma charges may be exhausted to the semiconductor substrate 100 through the conductive via 140. In other words, an electric path CP may be created between the via hole H1 and the semiconductor substrate 100, which makes it possible to exhaust the plasma charges to the semiconductor substrate 100, thereby preventing the plasma charges from being accumulated in the conductive via 140. The accumulation of charges in the via 140, which would otherwise occur if the conductive via 140 is electrically isolated from the substrate 100, can lead to an electrical breakdown or physical damage of the via insulating layer 110. Further, the accumulation of the plasma charges can lead to chemical reaction between constituents of the conductive via 140 and the semiconductor substrate 100 (e.g., between copper and silicon) and deterioration in electrical characteristics of the semiconductor substrate 100. Still further, the accumulation of the plasma charges may additionally lead to a failure in a subsequent back-lap process of recessing the semiconductor substrate 100, which would reduce a production yield.

In the present embodiment, the conductive via 140 and the semiconductor substrate 100 are electrically connected to each other through the bottom surface 101$f$ of the vertical hole 101, and the electric path CP is thereby formed to allow plasma charges to be exhausted to the semiconductor substrate 100. As such, the drawbacks discussed above are avoided and production yields are enhanced.

Figure 4H:
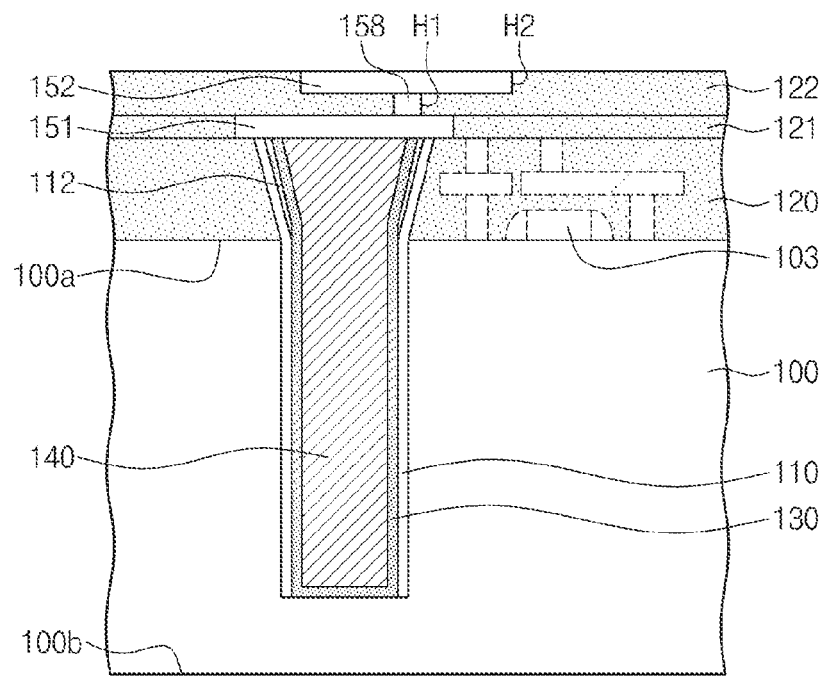

Continuing now to FIG. 4H, the first via 158 and the second metal line 152 may be formed on the first interlayer insulating layer 121. For example, the first via 158 may be formed by filling the via hole H1 with a conductive layer. Further, the second metal line 152 may be formed by filling the trench H2 with a conductive layer. The first via 158 and the second metal line 152 may be concurrently formed by a single process (for example, a damascene process). The second metal line 152 may be electrically connected to the first metal line 151 through the first via 158.

Figure 4I:
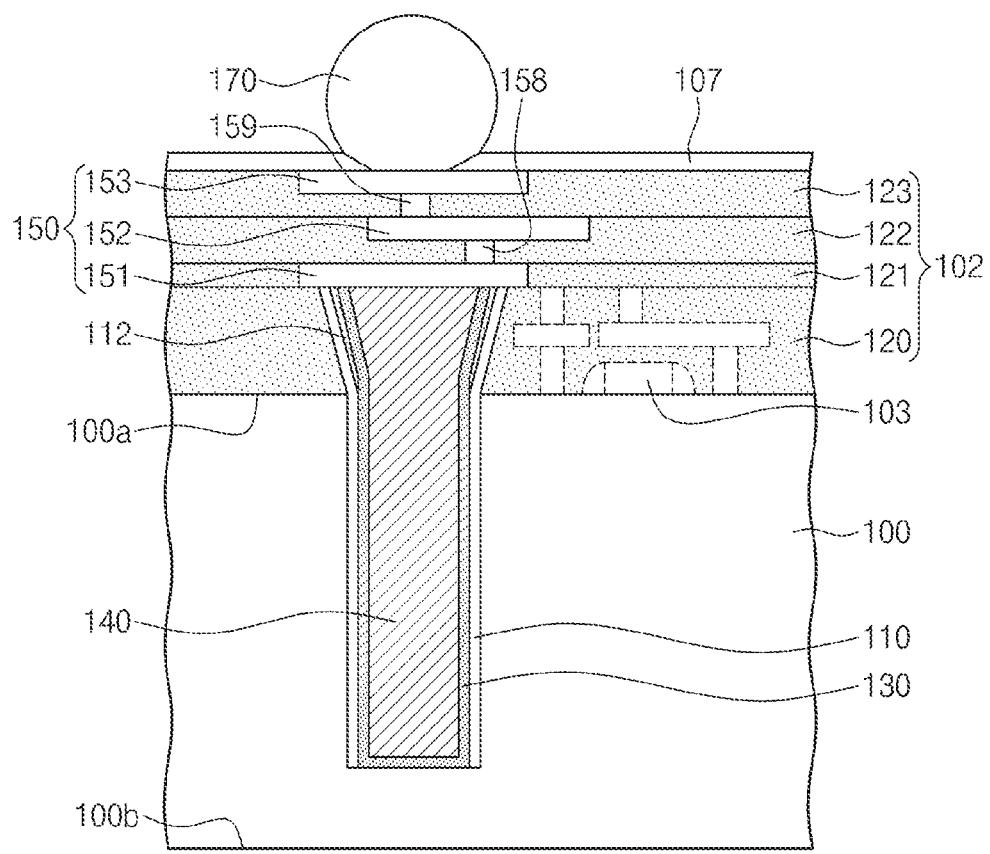

Referring now to FIG. 4I, the second via 159 and the third metal line 153 may be formed. For example, after forming the third interlayer insulating layer 123 on the second interlayer insulating layer 122, a damascene process may be performed to form the second via 159 and the third metal line 153 electrically connected to the second metal line 152 and the second via 159, respectively. The third interlayer insulating layer 123 may be formed by depositing an insulating layer, which is formed of the same or similar material as the first interlayer insulating layer 121. The upper protection layer 107 may be formed on the third interlayer insulating layer 123 to expose the third metal line 153, and the upper terminal 170 may be formed to be electrically connected to the third metal line 153. The upper terminal 170 may be a solder ball.

The first to third metal lines 151-153 and the vias 158 and 159 may be electrically connected to the integrated circuit 103, thereby constituting the metal lines 150 of a multi-layered structure. The circuit layer 102 including the integrated circuit 103 and the metal line 150 may be provided on the top surface (active surface) 100$a$ of the semiconductor substrate 100.

Figure 4J:
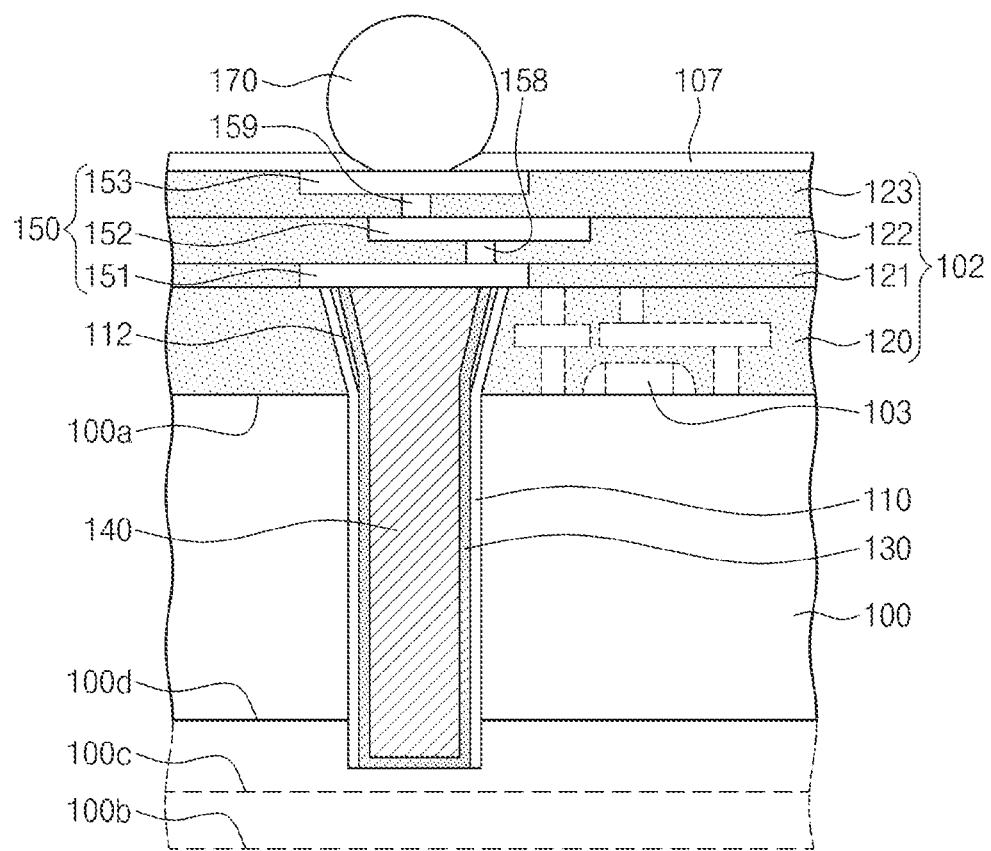

Referring now to FIG. 4J, a back lap process of recessing the semiconductor substrate 100 may be performed in such a way that the conductive via 140 protrudes from the recessed surface of the semiconductor substrate 100. For example, the first bottom surface 100$b$ of the semiconductor substrate 100 may be recessed by at least one of etching, chemical-mechanical polishing, or grinding processes, in which etchant or slurry capable of selectively removing the material (e.g., silicon) constituting the semiconductor substrate 100 is used.

The recess or back lap process may be performed to form a third bottom surface 100$d$, which is positioned closer to the top surface 100$a$ than was the first bottom surface 100$b$, and through which the conductive via 140 protrudes. For example, a chemical-mechanical polishing (CMP) process may be performed on the first bottom surface 100$b$ of the semiconductor substrate 100 to form a second bottom surface 100$c$ positioned between a bottom surface of the conductive via 140 and the first bottom surface 100$b$, and then, an etching process may be further performed on the second bottom surface 100$c$ to form the third bottom surface 100$d$ exposing the conductive via 140.

In example embodiments, the top surface 100$a$ of the semiconductor substrate 100 may be an active surface and the third bottom surface 100$d$ may be an inactive surface.

Figure 4K:
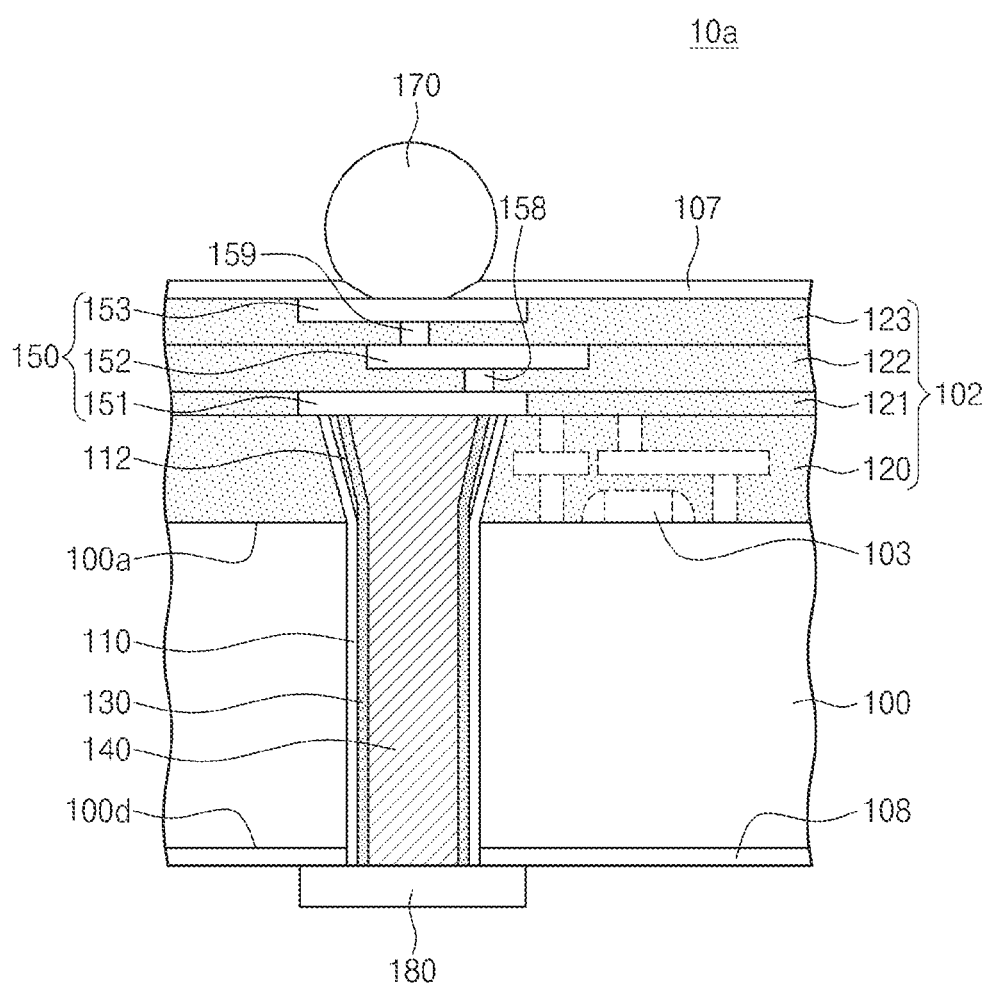

Referring to FIG. 4K, the lower protection layer 108 may be formed on the inactive surface 100d of the semiconductor substrate 100. As an example, the formation of the lower protection layer 108 may include depositing a silicon oxide layer or a silicon nitride layer on the inactive surface 100d to cover the conductive via 140 and performing a planarization process (e.g., a chemical-mechanical polishing process) thereon. The conductive via 140 may be exposed through the lower protection layer 108. On the lower protection layer 108, the lower terminal 180 may be formed to be electrically connected to the conductive via 140.

As a result of the above-described series of the processes, the semiconductor device 1 with the vertical connecting portion 10a, which was described with reference to FIG. 1, can be fabricated.

FIGS. 6A through 6D are sectional views illustrating a method of fabricating a semiconductor device, according to other example embodiments of the inventive concept. FIG. 7A is an enlarged sectional view illustrating a portion of FIG. 6B. FIGS. 7B and 7C are sectional views illustrating other examples of the same portion of FIG. 6B.

Figure 6A:
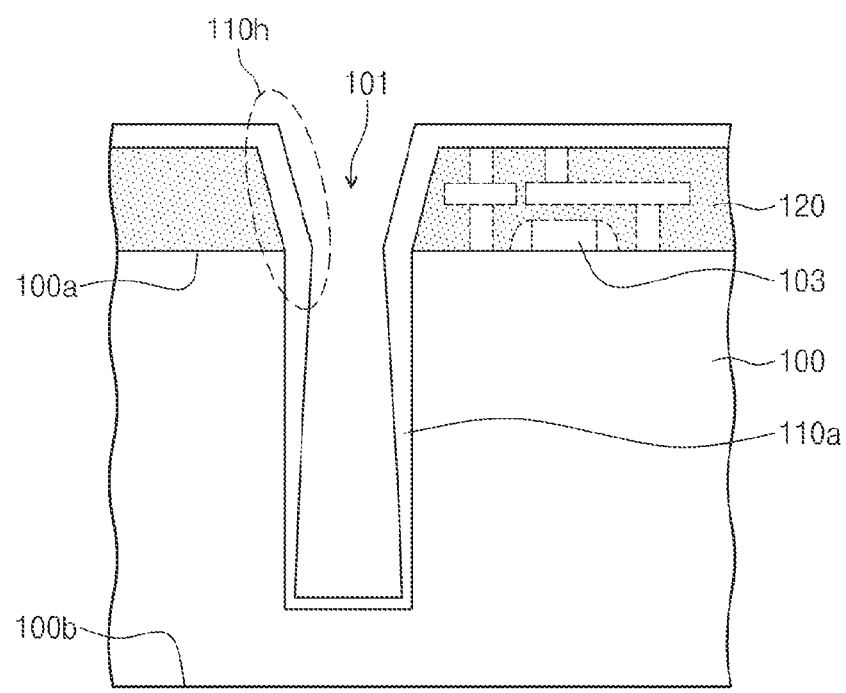
FIGS. 6A through 6D are sectional views for reference in describing a method of fabricating a semiconductor device according to other example embodiments of the inventive concept.
Figure 7A:
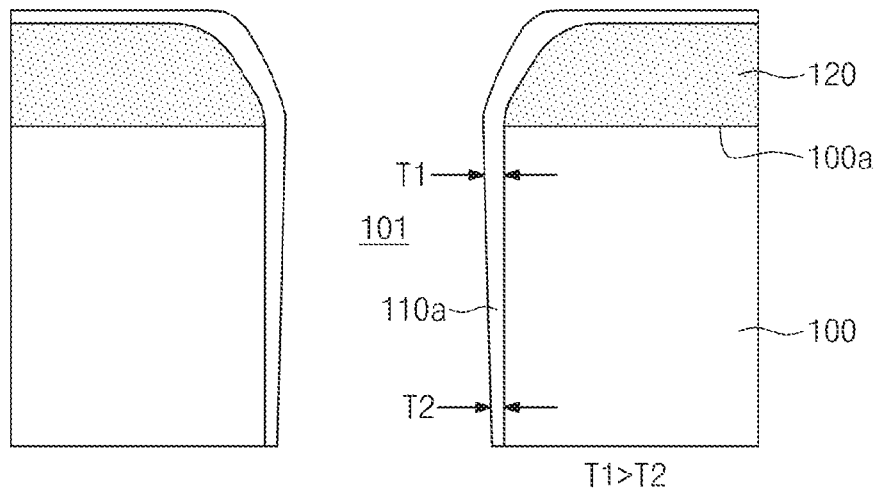
FIG. 7A is an enlarged sectional view illustrating a portion of FIG. 6B according to an example embodiment of the inventive concept.
Figure 7B:
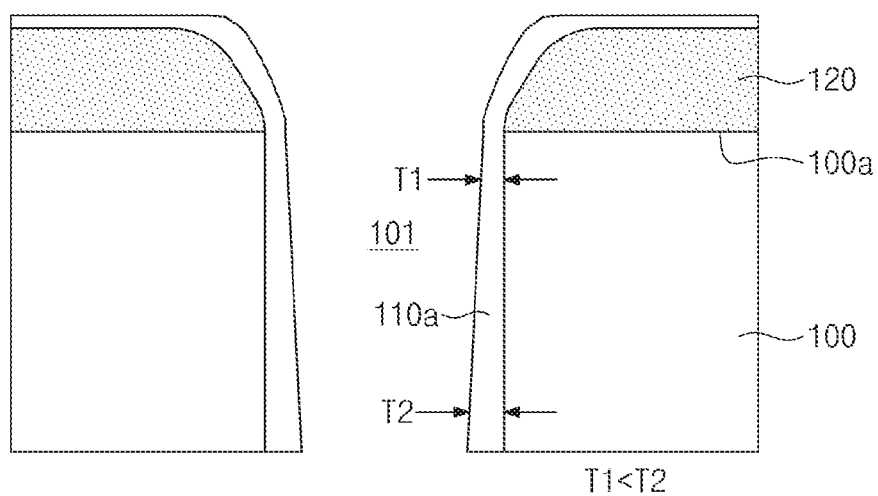
FIGS. 7B and 7C are sectional views illustrating respective modifications of the example embodiment of FIG. 7A.
Figure 7C:
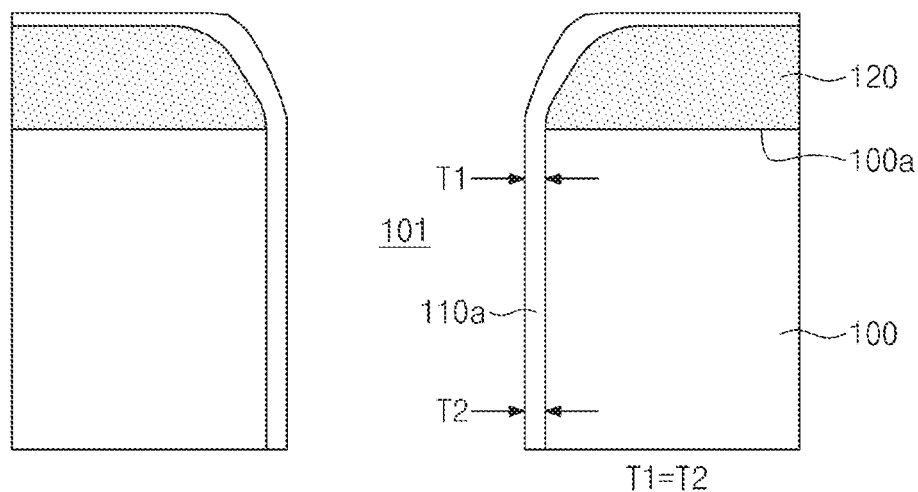

Referring to FIG. 6A, the vertical hole 101 may be formed in the semiconductor substrate 100 using, for example, the same or similar process as that described with reference to FIGS. 4A and 4B, and the insulating layer 110a may be formed on an inner surface of the vertical hole 101. The insulating layer 110a may be formed by a deposition process with a poor step coverage property. As an example, the insulating layer 110a may be formed by a plasma deposition process using silane gas. In the case where the deposition process with a poor step coverage property is used, the insulating layer 110a may form to have an overhang 110h at or near a top entrance of the vertical hole 101.

Figure 6B:
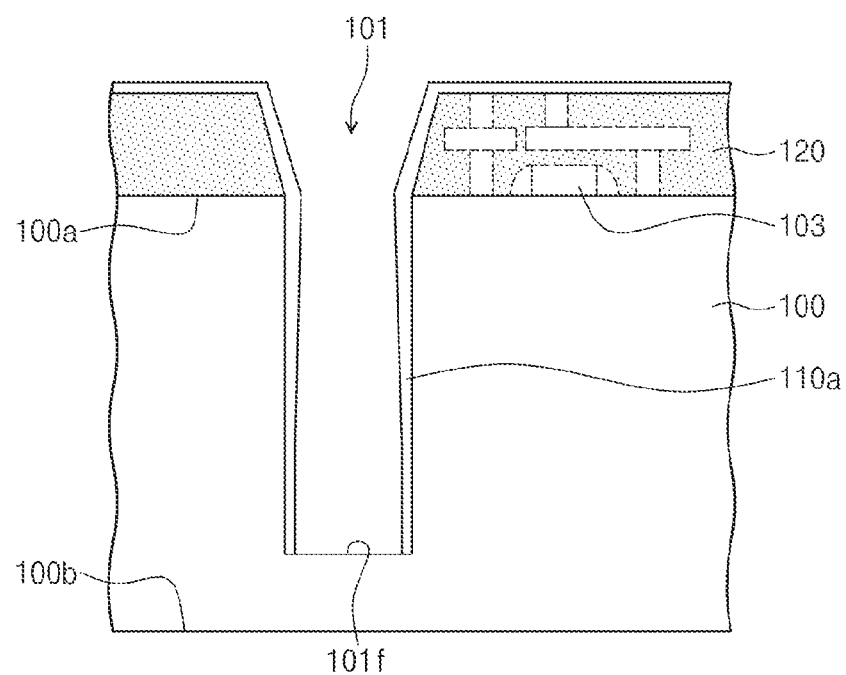

Referring to FIG. 6B, a portion of the insulating layer 110a may be removed by, for example, a dry etching process, and thus, the semiconductor substrate 100 may be exposed through the bottom surface 101f of the vertical hole 101. As a result of a difference in etch removal or etch rate, the dry etching process may lead to a thickness variation of the insulating layer 110a.

As an example, as shown in FIG. 7A, in the case where the insulating layer 110a is formed to have a relatively thick deposition thickness, an upper portion of the insulating layer 110a may be thicker than a lower portion thereof, regardless of the presence or absence of the etch removal. In other words, the insulating layer 110a may have a thickness decreasing in a direction away from the top surface 100a of the semiconductor substrate 100 or in a depth (downward) direction. Here, the thickness T1 is greater than the thickness T2.

As another example, as shown in FIG. 7B, the etch re may occur in such a way that an etched thickness is larger at the upper portion of the insulating layer 110a than at the lower portion thereof. In this case, the thickness of the insulating layer 110a may increase in the downward direction away from the top surface 100a of the semiconductor substrate 100 (i.e., T1<T2).

As other examples, as shown in FIG. 7C, the etch removal may occur in such a way that the insulating layer 110a has a uniform thickness, when measured along its extending direction (i.e., T1=T2).

Figure 6C:
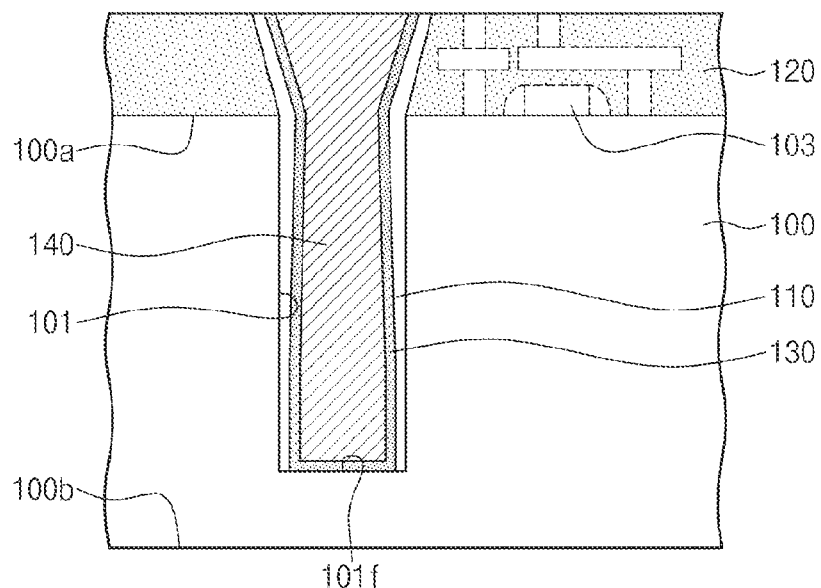

Referring to FIG. 6C, the same or similar process as that described with reference to FIGS. 4D and 4E may be performed to form the conductive via 140, which is electrically connected to the semiconductor substrate 100 through the bottom surface 101f of the vertical hole 101. The via insulating layer 110 may be formed to have a uniform or non-uniform thickness, when measured along its extending direction, as previously described with reference to FIGS. 3B through 3D. Further, as previously described with reference to FIG. 4E, an electrical method may be performed to test for a process failure (e.g., occurrence of a void) in the formation of the conductive via 140.

Figure 6D:
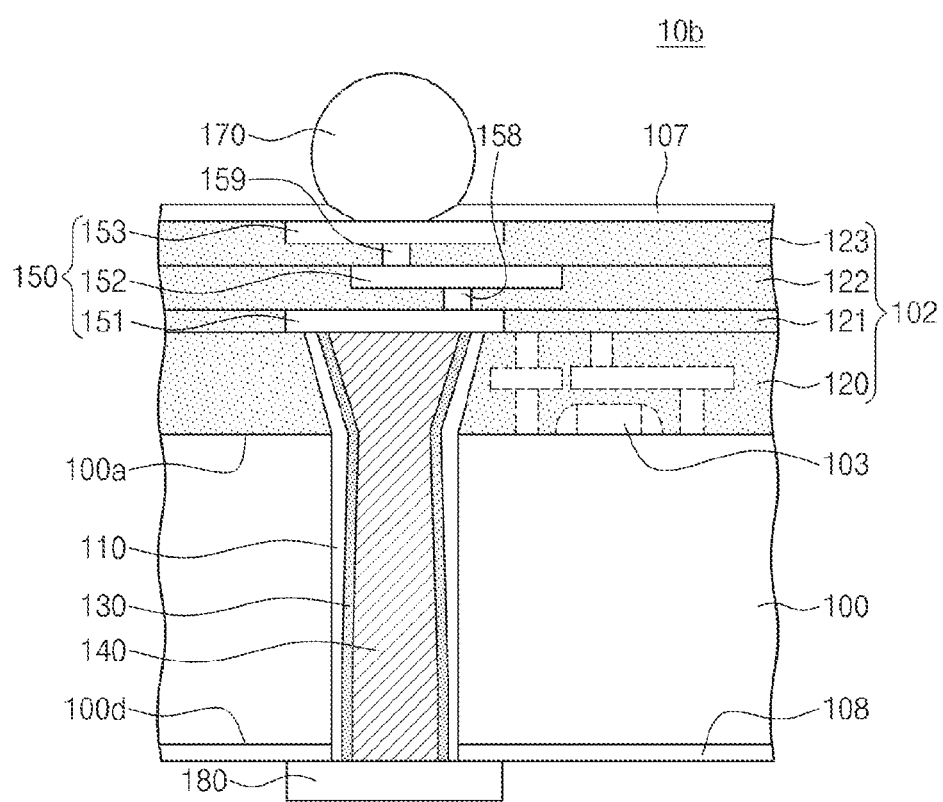

Referring to FIG. 6D, the process described with reference to FIGS. 4G through 4K may be performed in the same or similar manner, and as a result, the semiconductor device 1 (e.g., of FIG. 1) may be formed to have the vertical connecting portion 10b. As previously described with reference to FIG. 4G, it is possible to prevent plasma charges from being accumulated in the conductive via 140, when a plasma etching process is performed to form the via 158 and/or the second metal line 152.

Figure 8A:
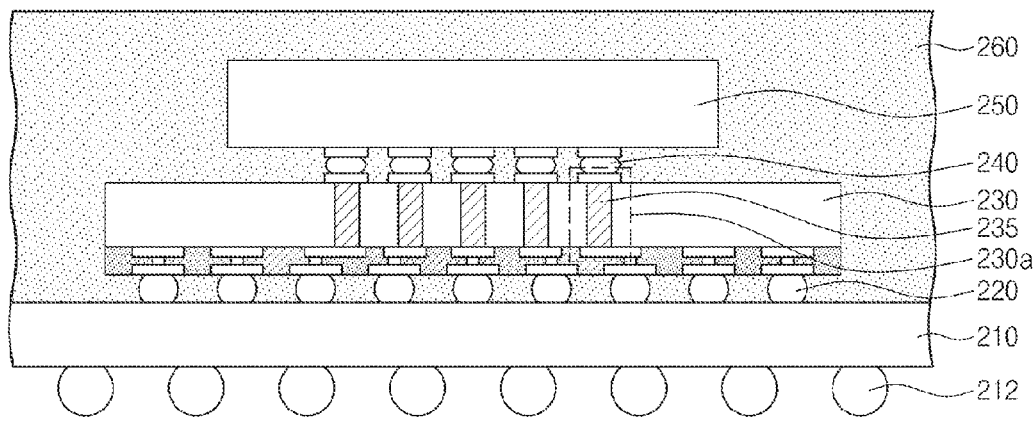
FIG. 8A is a sectional view illustrating an example of a stacked semiconductor package, to which a through electrode according to example embodiments of the inventive concept is applied.
Figure 8B:
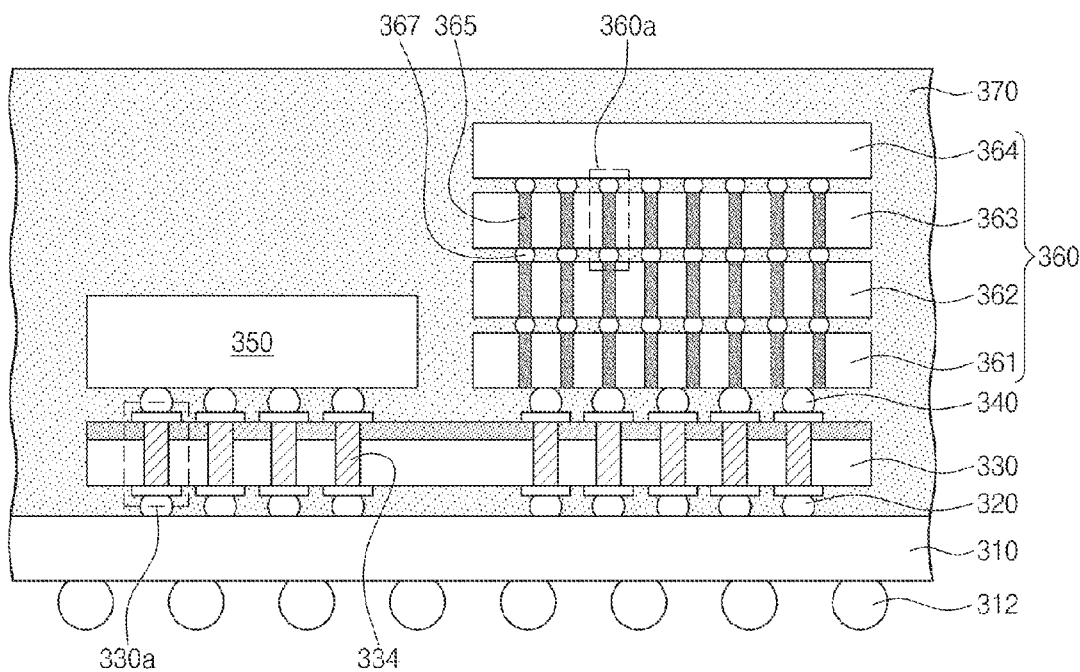
FIG. 8B is a sectional view illustrating an example of a semiconductor module, to which a through electrode according to example embodiments of the inventive concept is applied.
Figure 8C:
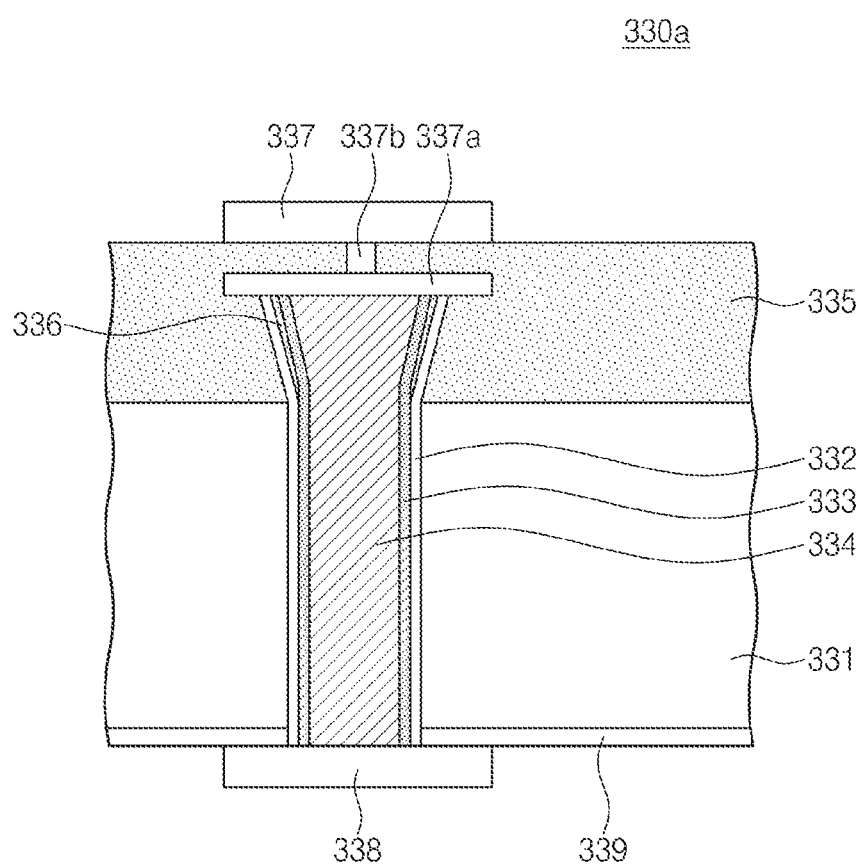
FIG. 8C is an enlarged sectional view illustrating a portion of FIG. 8B according to an example embodiment of the inventive concept.

FIG. 8A is a sectional view illustrating a three-dimensional stacking structure of a semiconductor package, to which a through electrode according to example embodiments of the inventive concept is applied. FIG. 8B is a sectional view illustrating a semiconductor module, to which a through electrode according to example embodiments of the inventive concept is applied. FIG. 8C is an enlarged sectional view illustrating a portion of FIG. 8B.

Referring to FIG. 8A, a semiconductor package 20 may include a package substrate 210 (e.g., a printed circuit board) having outer terminals 210 attached thereto, an application processor 230 mounted on the package substrate 210, a memory chip 250 stacked on the application processor 230, and a mold layer 260 covering the application processor 230 and the memory chip 250. The semiconductor package 20 may be used as a part of mobile products, such as a cellular phone or a tablet computer.

The application processor 230 may be electrically connected to the package substrate 210 through a solder ball 220 disposed on the package substrate 210. The memory chip 250 may be electrically connected to the application processor 230 through a solder ball 240 disposed on the application processor 230.

The application processor 230 may be mounted on the package substrate 210 in such a way that an active surface thereof faces the package substrate 210 or the memory chip 250. The memory chip 250 may be stacked on the application processor 230 in such a way that an active surface thereof faces the application processor 230.

The application processor 230 may include an electrical connection structure 230a with a through electrode 235. The through electrode 235 may be electrically connected to the solder ball 220 and the solder ball 240. The electrical connection structure 230a may be configured to have the same or similar structure as the vertical connecting portion 10a or 10b shown in FIG. 2A or 3A. Further, the electrical connection structure 230a may be configured to have the same technical features as those of the vertical connecting portion 10a or 10b described with reference to FIG. 2A or 3A.

Referring to FIG. 8B, a semiconductor module 30 may be a memory module including a package substrate 310 (e.g., a printed circuit board) attached with an outer terminal 312, a chip stack 360 and a graphic processing unit (GPU) 350 mounted on the package substrate 310, and a mold layer 370 covering the chip stack 360 and the GPU 350. The semiconductor module 30 may further include an interposer 330 provided on the package substrate 310.

The chip stack 360 may include a plurality of high-band memory chips 361, 362, 363, and 364, which are sequentially stacked. The memory chips 361-364 may be electrically connected to each other through solder balls 367. At least one of the memory chips 361-364 may include an electrical connection structure 360a, in which a through electrode 365 is provided.

For example, each of the first, second, and third memory chips 361, 362, and 363 may be configured to include the electrical connection structure 360a. The through electrode may not be provided in the fourth memory chip 364. Alternatively, the fourth memory chip 364 may include the electrical connection structure 360a provided with the through electrode 365.

The electrical connection structure 360a of the chip stack 360 may be configured to have the same or similar structure as the vertical connecting portion 10a or 10b shown in FIG. 2A or 3A. Further, the electrical connection structure 360a may be configured to have substantially the same technical features as those of the vertical connecting portion 10a or 10b described with reference to FIG. 2A or 3A.

The graphic processing unit 350 and the chip stack 360 may be electrically connected to the interposer 330 through a solder ball 340 disposed on the interposer 330. The interposer 330 may be electrically connected to the package substrate 310 through a solder ball 320 disposed on the package substrate 310.

The interposer 330 may include an electrical connection structure 330a, in which a through electrode 334 is provided. In example embodiments, the electrical connection structure 330a may be configured to have the same or similar structure as the vertical connecting portion 10a or 10b shown in FIG. 2A or 3A.

As an example, as shown in FIG. 8C, the electrical connection structure 330a of the interposer 330 may include a conductive via 334a vertically penetrating a semiconductor substrate 331 (e.g., a silicon wafer). In certain cases, an insulating layer 335 may be further provided on the semiconductor substrate 331, and the conductive via 334a may be provided to be inserted into at least a portion of the insulating layer 335. An upper pad 337 may be provided on the insulating layer 335 to be electrically connected to the conductive via 334a. The upper pad 337 may be coupled to the solder ball 340 of FIG. 8B.

The conductive via 334a may be provided to vertically penetrate a portion of the insulating layer 335. In this case, a metal line 337a may be further provided to be coupled to a top surface of the conductive via 334a, and a via 337b may be further provided to electrically connect the upper pad 337 to the metal line 337a. As another example, the conductive via 334a may be provided to completely penetrate the insulating layer 335 and may be directly coupled to the upper pad 337. In this case, the formation of the metal line 337a and the via 337b may be omitted.

A via insulating layer 332 may be provided around the conductive via 334a to electrically isolate the conductive via 334a from the semiconductor substrate 331. A barrier layer 333 may be further provided between the conductive via 334a and the via insulating layer 332 to prevent constituents (e.g., copper) of the conductive via 334a from being diffused into the semiconductor substrate 331.

A buffer layer 336 may be provided between the conductive via 334a and the via insulating layer 332. The buffer layer 336 may be provided to enclose an upper side surface of the conductive via 334a. In the case where the barrier layer 333 is further provided, the buffer layer 336 may be provided between the barrier layer 333 and the via insulating layer 332. The buffer layer 336 may play substantially the same role as the buffer layer 112 of FIG. 2A and may be configured to have substantially the same features as those of the buffer layer 112 of FIG. 2A.

The conductive via 334a may have a bottom surface coupled to a lower pad 338. The solder ball 320 of FIG. 8B may be coupled to the lower pad 338. A lower protection layer 339 may be provided on a bottom surface of the semiconductor substrate 331 to electrically isolate the lower pad 338 from the semiconductor substrate 331.

Figure 9A:
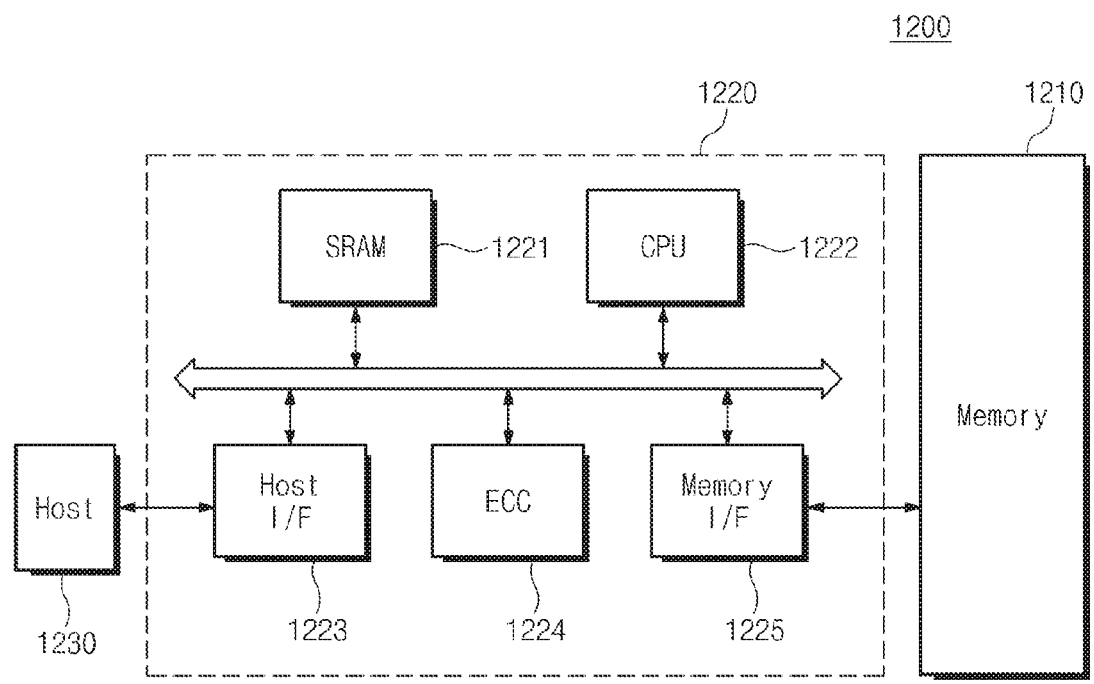
FIG. 9A is a schematic block diagram illustrating an example of a memory card which may include a semiconductor device according to example embodiments of the inventive concept.
Figure 9B:
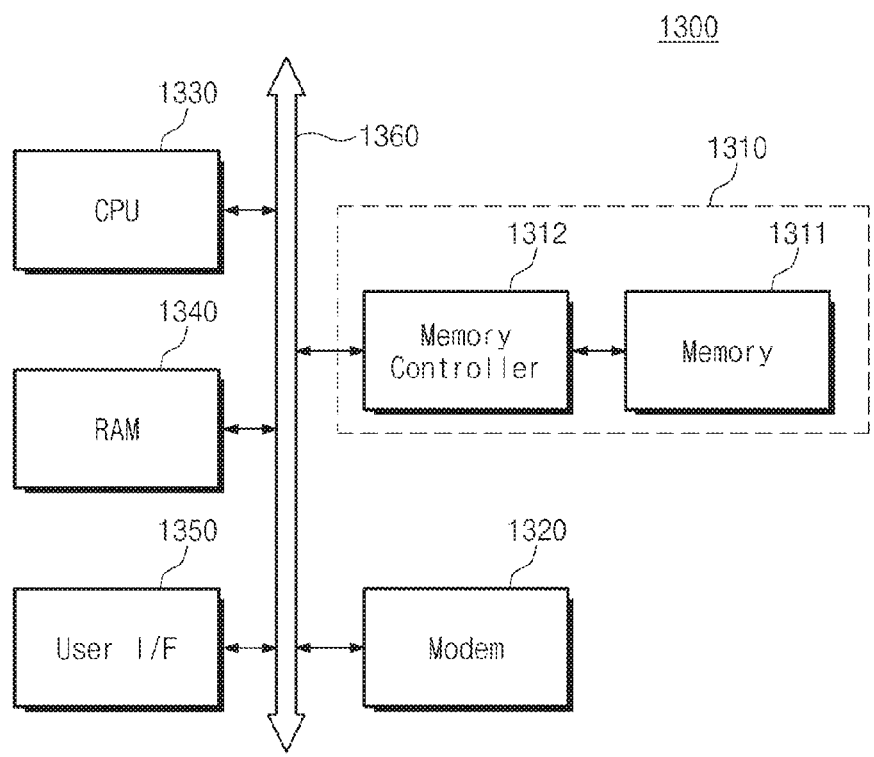
FIG. 9B is a schematic block diagram illustrating an example of an information processing system which may include a semiconductor device according to example embodiments of the inventive concept.

FIG. 9A is a schematic block diagram illustrating an example of a memory card including a semiconductor device according to example embodiments of the inventive concept. FIG. 9B is a schematic block diagram illustrating an example of an information processing system including a semiconductor device according to example embodiments of the inventive concept.

Referring to FIG. 9A, a memory card 1200 may include a memory device 1210, in which at least one of the semiconductor devices according to example embodiments of the inventive concept is provided. As an example, the memory card 1200 may include a memory controller 1220 controlling general data exchanges between a host 1230 and the memory device 1210. A static random access memory (SRAM) 1221 may be used as an operating memory of a processing unit 1222. A host interface 1223 may include a data exchange protocol of the host 1230 connected to the memory card 1200. An error correction code block 1224 may detect and correct errors included in data read from the memory device 1210. A memory interface 1225 may interface with the memory device 1210. The processing unit 1222 may perform general control operations for data exchange of the memory controller 1220.

Referring to FIG. 9B, an information processing system 1300 may include a memory system 1310, in which at least one of the semiconductor devices according to example embodiments of the inventive concept is provided. For instance, the information processing system 1300 may be a mobile device and/or a desktop computer. The information processing system 1300 may further include a modem 1320, a central processing unit (CPU) 1330, a random access memory (RAM) 1340, and a user interface 1350, electrically connected to the memory system 1310 through a system bus 1360.

The memory system 1310 may include a memory device 1311 and a memory controller 1312, and in some embodiments, the memory system 1310 may be configured substantially identical to the memory card 1200 described with respect to FIG. 9A. Data processed by the central processing unit 1330 and/or input from the outside may be stored in the memory system 1310.

The information processing system 1300 may be configured to serve as one of memory cards, solid state drives (SSDs), camera image sensors, application chipsets, or the like. As an example, the memory system 1310 may be used as a portion of a solid state drive (SSD), and in this case, the information processing system 1300 may stably and reliably store a large amount of data in the memory system 1310.

According to example embodiments of the inventive concept, during a fabrication process, a bottom portion of a via insulating layer may be removed to expose a substrate, and thus, a through electrode can be electrically connected to the substrate. In other words, it is possible to create a current path, allowing plasma charges to be exhausted to the substrate. As a result, it is possible to prevent plasma charges from being accumulated in the through electrode and consequently to prevent a process failure and increase a production yield of a fabrication process.

Further, since the substrate is electrically connected to the through electrode, it is possible to easily monitor the presence or absence of void in the through electrode, during a fabrication process. Accordingly, occurrence of the void in the through electrode can be detected in an early stage of the fabrication process, and it is possible to fabricate a semiconductor device having good electric characteristics with an increased yield.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a semiconductor substrate with an upper surface and a lower surface opposite the upper surface;
   a circuit layer including an interlayer insulating layer on the upper surface of the substrate;
   a through electrode penetrating through the interlayer insulating layer and the substrate, and electrically connected to the circuit layer, wherein the through electrode includes a conductive via, and the conductive via includes:
      a tapered portion that penetrates through the interlayer insulating layer and that decreases in width in a depth direction of the conductive via; and
      a non-tapered portion penetrating through the substrate that is constant in width in the depth direction of the conductive via;
   an insulating layer surrounding the conductive via, and located between the conductive via and the substrate and between the conductive via and the interlayer insulating layer; and
   a buffer layer located between at least part of the tapered portion of the conductive via and the insulating layer,
   wherein the buffer layer is absent between a lower part of the non-tapered portion of the conductive via and the insulating layer.

2. The semiconductor device of claim 1, wherein the tapered portion of the conductive via extends from an upper surface of the interlayer insulating layer to a lower surface of the interlayer insulating layer, and the non-tapered portion of the conductive via extends from the upper surface of the substrate to the lower surface of the substrate.

3. The semiconductor device of claim 2, wherein the buffer layer is further located between an upper part of the non-tapered portion of the conductive via and the insulating layer.

4. A semiconductor device, comprising:
   a semiconductor substrate with an upper surface and a lower surface opposite the upper surface;
   a circuit layer including an interlayer insulating layer on the upper surface of the substrate;
   a through electrode penetrating through the interlayer insulating layer and the substrate, and electrically connected to the circuit layer, wherein the through electrode includes a conductive via, and the conductive via includes a tapered portion that penetrates through the interlayer insulating layer and that decreases in width in a depth direction of the conductive via;
   an insulating layer surrounding the conductive via, and located between the conductive via and the substrate and between the conductive via and the interlayer insulating layer; and
   a buffer layer located between at least part of the tapered portion of the conductive via and the insulating layer,
   wherein the conductive via includes a non-tapered portion penetrating through the substrate that is constant in width in the depth direction of the conductive via,
   wherein the tapered portion of the conductive via extends from an upper surface of the interlayer insulating layer to a lower surface of the interlayer insulating layer, and the non-tapered portion of the conductive via extends from the upper surface of the substrate to the lower surface of the substrate, and
   wherein the buffer layer is not located between an upper part of the non-tapered portion of the conductive via and the insulating layer.

5. The semiconductor device of claim 4, wherein a thickness of the buffer layer decreases in the depth direction of the conductive via.

6. The semiconductor device of claim 4, wherein the buffer layer surrounds the tapered portion of the conductive via.

7. The semiconductor device of claim 4, wherein a minimum inner diameter of the buffer layer is less than a minimum inner diameter of the insulating layer.

8. The semiconductor device of claim 4, further comprising:
   a barrier layer interposed between the conductive via and the insulating layer, and between the conductive via and the buffer layer.

9. The semiconductor device of claim 4, wherein a thickness of the insulating layer varies in a depth direction of the conductive via.

10. A semiconductor device of claim 4, wherein the lower surface of the substrate is inactive.

11. The semiconductor device of claim 4, wherein the buffer layer is further located between an upper part of the non-tapered portion of the conductive via and the insulating layer.

* * * * *